(12) United States Patent
Tominaga et al.

(10) Patent No.: US 11,112,895 B2
(45) Date of Patent: Sep. 7, 2021

(54) ACTIVE MATRIX SUBSTRATE, TOUCH-PANEL-EQUIPPED DISPLAY DEVICE INCLUDING SAME, AND LIQUID CRYSTAL DISPLAY DEVICE INCLUDING SAME

(71) Applicant: SHARP KABUSHIKI KAISHA, Sakai (JP)

(72) Inventors: Masakatsu Tominaga, Sakai (JP); Kuniko Maeno, Sakai (JP); Shingo Kamitani, Sakai (JP); Yoshihito Hara, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/308,411

(22) PCT Filed: Jun. 7, 2017

(86) PCT No.: PCT/JP2017/021149
§ 371 (c)(1),
(2) Date: Dec. 7, 2018

(87) PCT Pub. No.: WO2017/213173
PCT Pub. Date: Dec. 14, 2017

(65) Prior Publication Data
US 2019/0196638 A1    Jun. 27, 2019

(30) Foreign Application Priority Data
Jun. 9, 2016    (JP) .............................. JP2016-115565

(51) Int. Cl.
*G06F 3/041*    (2006.01)
*G02F 1/1343*    (2006.01)
(Continued)

(52) U.S. Cl.
CPC .......... *G06F 3/0412* (2013.01); *G02F 1/1333* (2013.01); *G02F 1/1343* (2013.01);
(Continued)

(58) Field of Classification Search
CPC ....... G06F 3/0416; G06F 3/044; G02F 1/1343
See application file for complete search history.

(56) References Cited

U.S. PATENT DOCUMENTS

2001/0046027 A1    11/2001    Tai et al.
2003/0063074 A1*    4/2003    Kumagawa .......... G09G 3/3208
                                                              345/204
(Continued)

FOREIGN PATENT DOCUMENTS

JP    2001-083540 A    3/2001
JP    2009-058913 A    3/2009
(Continued)

*Primary Examiner* — Sepehr Azari
(74) *Attorney, Agent, or Firm* — ScienBiziP, P.C.

(57) ABSTRACT

Provided is an active matrix substrate in which parasitic capacitance can be reduced and the display quality can be improved, a touch-panel-equipped display device including the same, and a liquid crystal display device including the same. An active matrix substrate 1 includes a plurality of pixel electrodes 31; a plurality of counter electrodes provided so as to be opposed to the pixel electrodes 31, respectively, capacitors being formed between the counter electrodes 21 and the pixel electrodes 31; a conductive layer provided on a side opposite to the counter electrodes 21 with respect to the pixel electrodes 31; a first insulating layer 461; and a second insulating layer 462. The first insulating layer 461 is arranged between the pixel electrodes 31 and the conductive layer, and the second (Continued)

insulating layer 462 is arranged between the pixel electrodes 31 and the counter electrodes 21. The conductive layer includes auxiliary capacitance electrode portions 48 that are provided so as to be opposed to the pixel electrodes, respectively, and form capacitors between the same and the pixel electrodes 31, and the auxiliary capacitance electrode portions 48 and the other portions of the conductive layer than the auxiliary capacitance electrode portions 48 are positioned apart from each other.

14 Claims, 14 Drawing Sheets

(51) Int. Cl.
*G02F 1/1333* (2006.01)
*G06F 3/044* (2006.01)
*G02F 1/1368* (2006.01)
*G02F 1/1362* (2006.01)
*H01L 27/12* (2006.01)

(52) U.S. Cl.
CPC ........ *G02F 1/1368* (2013.01); *G02F 1/13338* (2013.01); *G02F 1/134309* (2013.01); *G02F 1/136286* (2013.01); *G06F 3/044* (2013.01); *G06F 3/0443* (2019.05); *H01L 27/124* (2013.01); *G02F 2201/121* (2013.01); *G02F 2201/123* (2013.01); *G06F 2203/04103* (2013.01)

(56) References Cited

U.S. PATENT DOCUMENTS

| | | | | |
|---|---|---|---|---|
| 2003/0071931 | A1* | 4/2003 | Nakayoshi | G02F 1/1343 349/39 |
| 2009/0059110 | A1* | 3/2009 | Sasaki | G02F 1/134363 349/39 |
| 2013/0314343 | A1* | 11/2013 | Cho | G06F 3/0416 345/173 |
| 2014/0125626 | A1* | 5/2014 | Yang | G06F 3/044 345/174 |
| 2015/0192833 | A1* | 7/2015 | Ono | G02F 1/136213 349/41 |
| 2016/0328061 | A1* | 11/2016 | Chiang | G06F 3/0412 |
| 2016/0334660 | A1* | 11/2016 | Lin | G02F 1/1368 |
| 2016/0364072 | A1* | 12/2016 | Chiang | G06F 3/0416 |

FOREIGN PATENT DOCUMENTS

| | | |
|---|---|---|
| JP | 2011-081385 A | 4/2011 |
| JP | 2013-178523 A | 9/2013 |

* cited by examiner

F I G. 1
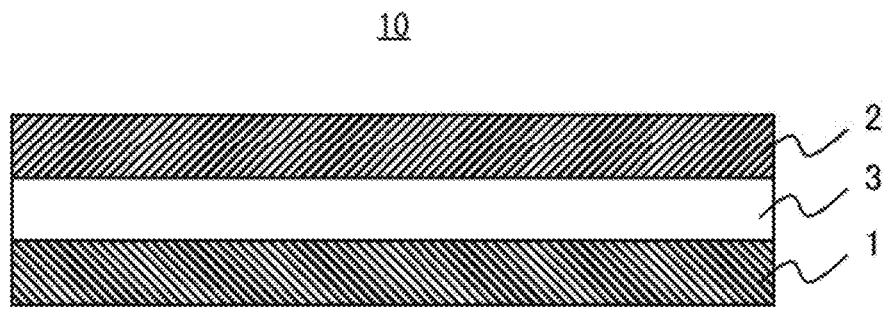

(Area A)  (Area B)

(Area A)  (Area B)

(Area A)  (Area B)

(Area A)  (Area B)

(Area A)  (Area B)

(Area A)  (Area B)

(Area A) (Area B)

(Area A) (Area B)

(Area A) (Area B)

(Area A) (Area B)

(Area A) (Area B)

(Area A) (Area B)

F I G. 8B
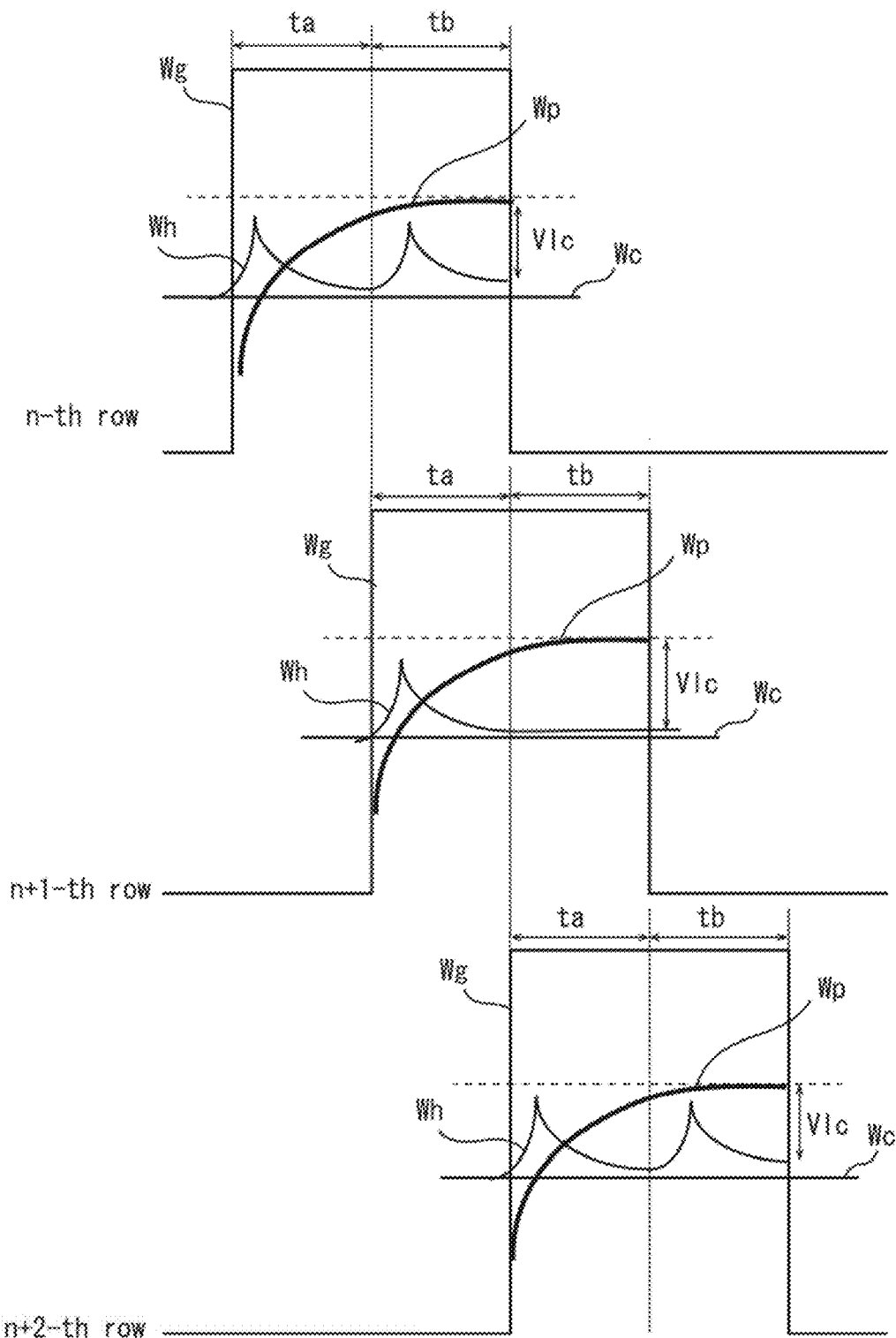

ACTIVE MATRIX SUBSTRATE, TOUCH-PANEL-EQUIPPED DISPLAY DEVICE INCLUDING SAME, AND LIQUID CRYSTAL DISPLAY DEVICE INCLUDING SAME

TECHNICAL FIELD

The present invention relates to an active matrix substrate, a touch-panel-equipped display device including the same, and a liquid crystal display device including the same.

BACKGROUND ART

JP-A-2009-58913 discloses a liquid crystal display device that is driven by the horizontal electric field method. This liquid crystal display device has such a configuration that common electrodes are arranged above and below pixel electrodes with an insulating film being interposed between the common electrodes and the pixels, in the thin film transistor (TFT) substrate. Besides, on a part of the common electrode provided below the pixel electrode, common electrode lines connected with the common electrode provided above the pixel electrode are provided.

SUMMARY OF THE INVENTION

Problem to be Solved by the Invention

With the structure in which the pixel electrode is interposed between common electrodes provided above and below the pixel electrode, with insulating films being interposed between each common electrode and the pixel electrode, as is the case with the configuration of JP-A-2009-58913, the capacitance of the pixel can be increased, as compared with a case where only one common electrode is provided. As the capacitance of the pixel is increased, however, it is necessary to increase the size of the TFT so that the driving competence of the TFT is increased in accordance with the capacitance of the pixel, but as the size of the TFT is increased, the parasitic capacitance of the TFT increases.

It is an object of the present invention to provide an active matrix substrate in which parasitic capacitances are reduced, whereby the display quality is improved, and to provide a touch-panel-equipped display device including the same, as well as a liquid crystal display device including the same.

An active matrix substrate in one embodiment of the present invention includes: a plurality of pixel electrodes; a plurality of counter electrodes provided so as to be opposed to the pixel electrodes, respectively, capacitors being formed between the counter electrodes and the pixel electrodes; a conductive layer provided on a side opposite to the counter electrodes with respect to the pixel electrodes; a first insulating layer; and a second insulating layer, wherein the first insulating layer is arranged between each of the pixel electrodes and the conductive layer, and the second insulating layer is arranged between the each pixel electrode and the corresponding one of the counter electrodes, and the conductive layer includes auxiliary capacitance electrode portions that are provided so as to be opposed to the pixel electrodes, respectively, and overlap with the pixel electrodes, thereby forming capacitors, and the auxiliary capacitance electrode portions and the other portions of the conductive layer than the auxiliary capacitance electrode portions are positioned apart from each other.

With the present invention, it is possible to reduce parasitic capacitances, and improve the display quality.

BRIEF DESCRIPTION OF DRAWINGS

FIG. 1 is a cross-sectional view illustrating a touch-panel-equipped display device in Embodiment 1.

FIG. 8B illustrates voltage waveforms when the pixels illustrated in FIG. 8A are charged.

MODE FOR CARRYING OUT THE INVENTION

Figure 2:
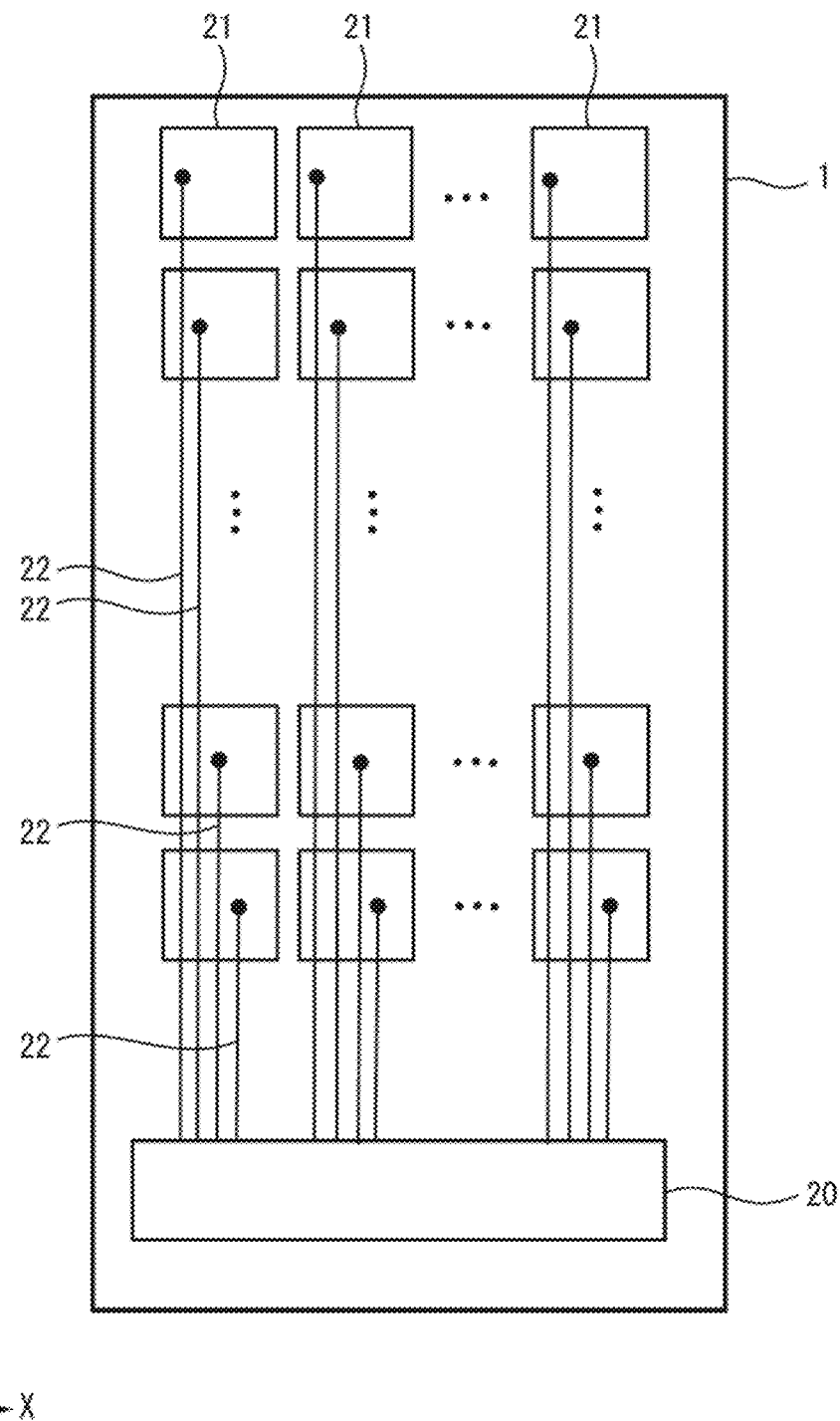
FIG. 2 schematically illustrates an exemplary arrangement of counter electrodes formed on the active matrix substrate illustrated in FIG. 1.

An active matrix substrate in one embodiment of the present invention includes: a plurality of pixel electrodes: a plurality of counter electrodes provided so as to be opposed to the pixel electrodes, respectively, capacitors being formed between the counter electrodes and the pixel electrodes; a conductive layer provided on a side opposite to the counter electrodes with respect to the pixel electrodes; a first insulating layer; and a second insulating layer, wherein the first insulating layer is arranged between each of the pixel electrodes and the conductive layer, and the second insulating layer is arranged between the each pixel electrode and the corresponding one of the counter electrodes, and the conductive layer includes auxiliary capacitance electrode portions that are provided so as to be opposed to the pixel electrodes, respectively, and overlap with the pixel electrodes, thereby forming capacitors, and the auxiliary capacitance electrode portions and the other portions of the conductive layer than the auxiliary capacitance electrode portions are positioned apart from each other (the first configuration).

According to the first configuration, the conductive layer is provided so as to be opposed to the pixel electrodes. The conductive layer includes auxiliary capacitance electrode portions that are provided at positions opposed to the pixel electrodes, respectively, and in the conductive layer, the auxiliary capacitance electrode portions and the portions other than the auxiliary capacitance electrode portions are arranged to be positioned apart from each other. As compared with a case where the auxiliary capacitance electrode portions of the conductive layer and the other portions of the same are not separated from each other, therefore, it is possible to prevent a capacitance between the pixel electrode and the auxiliary capacitance electrode portion from increasing to a level higher than required. Consequently, an appropriate pixel capacitance in accordance with the driving capability of the display control element can be achieved, and the display quality can be improved.

The active matrix substrate of the first configuration may be further characterized in further including: a plurality of gate lines; and a plurality of data lines that intersect with the gate lines, wherein the other portions of the conductive layer partially overlap with the data lines, and each of the other portions has a width greater than that of the data line (the second configuration).

According to the second configuration, a portion of the conductive layer that overlaps with the data line has a width greater than that of the data line. This portion of the conductive layer therefore interrupts between the pixel electrode and the data line. Consequently, capacitive coupling between the pixel electrode and the data line is reduced, whereby display defects such as shadowing can be reduced.

A touch-panel-equipped display device according to one embodiment of the present invention includes: the active matrix substrate of the first configuration; a counter substrate arranged so as to be opposed to the active matrix substrate; and a liquid crystal layer interposed between the active matrix substrate and the counter substrate, wherein the active matrix substrate further includes: a plurality of signal lines that are connected with each of the counter electrodes on the conductive layer, and supplies a touch detection driving signal to the connected counter electrodes (the third configuration).

With the third configuration, the pixel capacitance can be increased with use of a capacitance generated between the auxiliary capacitance electrode portion and the pixel electrode. As compared with a case where no auxiliary capacitance electrode portion is provided, therefore, a parasitic capacitance between the signal line and the pixel electrode has less influence. Further, since the conductive layer is divided into the auxiliary capacitance electrode portions and other portions that are separated from each other, the capacitance between the pixel electrode and the auxiliary capacitance electrode portion does not increase to a level higher than required. Consequently, an appropriate pixel capacitance in accordance with the driving capability of the display control element can be achieved, and the display quality can be improved.

The third configuration may be further characterized in that the active matrix substrate includes: a plurality of gate lines; and a plurality of data lines that intersect with the gate lines, wherein the counter electrodes are arrayed in a direction in which the gate lines extend and a direction in which the data lines extend, each of the auxiliary capacitance electrode portions is opposed to the corresponding one of the pixel electrodes with the first insulating layer being interposed therebetween, and is arranged approximately in parallel with the data lines (the fourth configuration).

According to the fourth configuration, while the counter electrodes are arranged so as to be arrayed in the direction in which the gate lines extend and in the direction in which the data lines extend, the auxiliary capacitance electrode portions are arranged so as to be opposed to the pixel electrodes, approximately in parallel with the data lines. With this configuration, even in a case where amounts of fluctuations of the voltages are different among the counter electrodes arrayed in the data line extending direction, the differences of voltages applied to the respective pixels can be reduced with the capacitances generated between the pixel electrodes and the auxiliary capacitance electrode portions.

The third or fourth configuration may be further characterized in that each of the signal lines has a specific resistance smaller than that of the conductive layer (the fifth configuration).

With the fifth configuration, the touch position detection accuracy can be improved.

Any one of the third to fifth configurations may be further characterized in that the active matrix substrate has a display area where the pixel electrodes are provided, and each of the counter electrodes is connected with the corresponding one of the auxiliary capacitance electrode portions in the display area (the sixth configuration).

With the sixth configuration, the pixel capacitance can be increased.

The sixth configuration may be further characterized in that the active matrix substrate includes contact holes formed in the first insulating layer and the second insulating layer, and each counter electrode is connected with the corresponding one of the auxiliary capacitance electrode portions through the contact hole (the seventh configuration).

With the seventh configuration, which the space for the part where the counter electrode and the auxiliary capacitance electrode portion are connected can be reduced, the pixel capacitance can be increased.

Any one of the third to fifth configurations may be further characterized in that the active matrix substrate has a display area where the pixel electrodes are provided, and each of the counter electrode is not connected with the corresponding one of the auxiliary capacitance electrode portions in the display area (the eighth configuration).

With the eighth configuration, the pixel capacitances can be increased.

The eighth configuration may be further characterized in that, while the driving signal is being supplied to the signal line, the auxiliary capacitance electrodes are in an electrically floating state (the ninth configuration).

With the ninth configuration, misdetection of a touch position can be reduced.

The fourth configuration may be further characterized in that, to each of the gate lines, a scanning voltage signal is supplied at fixed intervals, and periods while the scanning voltage signal is supplied to adjacent ones of the gate lines partially overlap with each other (the tenth configuration).

With the tenth configuration, insufficient charging of the pixel can be decreased.

The active matrix substrate of the first configuration may be further characterized in further including: a plurality of gate lines; a plurality of data lines that intersect with the gate lines; and an insulating layer including an organic film, between at least either the gate lines or the data lines, and the auxiliary capacitance electrodes (the eleventh configuration).

With the eleventh configuration, interference between the gate lines or the data lines and the auxiliary capacitance electrodes can be reduced.

The first configuration may be further characterized in that the auxiliary capacitance electrodes are provided so that each of the auxiliary capacitance electrodes is opposed to at least two of the counter electrodes (the twelfth configuration).

With the twelfth configuration, the pixel capacitances can be increased.

A liquid crystal display device according to one embodiment of the present invention includes the active matrix substrate of the first or second configuration; a counter substrate arranged so as to be opposed to the active matrix substrate; and a liquid crystal layer interposed between the active matrix substrate and the counter substrate (the thirteenth configuration).

According to the thirteenth configuration, the conductive layer is divided into the auxiliary capacitance electrode portions and other portions that are separated from each other. The capacitance between the pixel electrode and the auxiliary capacitance electrode portion therefore does not increase to a level higher than required. Consequently, an appropriate pixel capacitance in accordance with the driving capability of the display control element can be achieved, and the display quality can be improved.

Embodiment 1

The following description describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of a part of constituent members is omitted. Further, the dimension ratios of the constituent members illustrated in the drawings do not necessarily indicate the real dimension ratios.

FIG. 1 is a schematic cross-sectional view of a touch-panel-equipped display device 10 in the present embodiment. The touch-panel-equipped display device 10 in the present embodiment includes an active matrix substrate 1, a counter substrate 2, and a liquid crystal layer 3 interposed between the active matrix substrate 1 and the counter substrate 2. Each of the active matrix substrate 1 and the counter substrate 2 includes a glass substrate that is substantially transparent (having high translucency). The counter substrate 2 includes color filters that are not illustrated. Further, though the illustration is omitted, the touch-panel-equipped display device 10 includes a backlight that is provided so as to extend in a surface direction of the active matrix substrate 1 on a side opposite to the liquid crystal layer 3 in FIG. 1.

The touch-panel-equipped display device 10 has a function of displaying an image, and a function of detecting a position that a user touches on the displayed image (touch position). This touch-panel-equipped display device 10 is a so-called in-cell type touch panel display device in which elements necessary for detecting a touch position are formed on the active matrix substrate 1.

In the case of the touch-panel-equipped display device 10, the method for driving liquid crystal molecules contained in the liquid crystal layer 3 is the horizontal electric field driving method. To realize the horizontal electric field driving method, the pixel electrodes and the counter electrodes (common electrodes) for forming electric fields are formed on the active matrix substrate 1.

FIG. 2 schematically illustrates an exemplary arrangement of the counter electrodes 21 formed on the active matrix substrate 1. The counter electrodes 21 are formed on a liquid crystal layer 3 side surface of the active matrix substrate 1. As illustrated in FIG. 2, the counter electrode 21 is in a rectangular shape, and a plurality of the counter electrodes 21 are arrayed in matrix on the active matrix substrate 1. Each counter electrode 21 is, for example, in an approximately square shape whose side is approximately several millimeters. Though the illustration is omitted in this drawing, slits (having a width of, for example, several μm) for causing horizontal electric fields to be generated between the counter electrodes 21 and the pixel electrodes are formed in the counter electrodes 21.

On the active matrix substrate 1, a controller 20 is provided. The controller 20 performs a controlling operation for displaying an image and a controlling operation for detecting a touch position.

The controller 20 and each counter electrode 21 are connected by signal lines 22 extending in the Y axis direction. More specifically, the same number of the signal lines 22 as the number of the counter electrodes 21 are formed on the active matrix substrate 1.

The counter electrodes 21 in pairs with the pixel electrodes are used during the controlling operation for displaying an image, and are also used during the controlling operation for detecting a touch position.

Regarding the counter electrodes 21, parasitic capacitances are formed between the same and adjacent ones of the counter electrodes 21 or the like. When a human finger or the like touches the display screen of the display device 10, capacitors are formed between the same and the human finger or the like, and electrostatic capacitances increase. During the control for touch position detection, the controller 20 supplies a touch driving signal to the counter electrodes 21 through the signal lines 22, and receives a touch detection signal through the signal lines 22. By doing so, the controller 20 detects changes in the electrostatic capacitances at the positions of the counter electrodes 21, and detects a touch position. In other words, the signal lines 22 function as lines for the transmission/reception of the touch driving signal and the touch detection signal.

Figure 3:
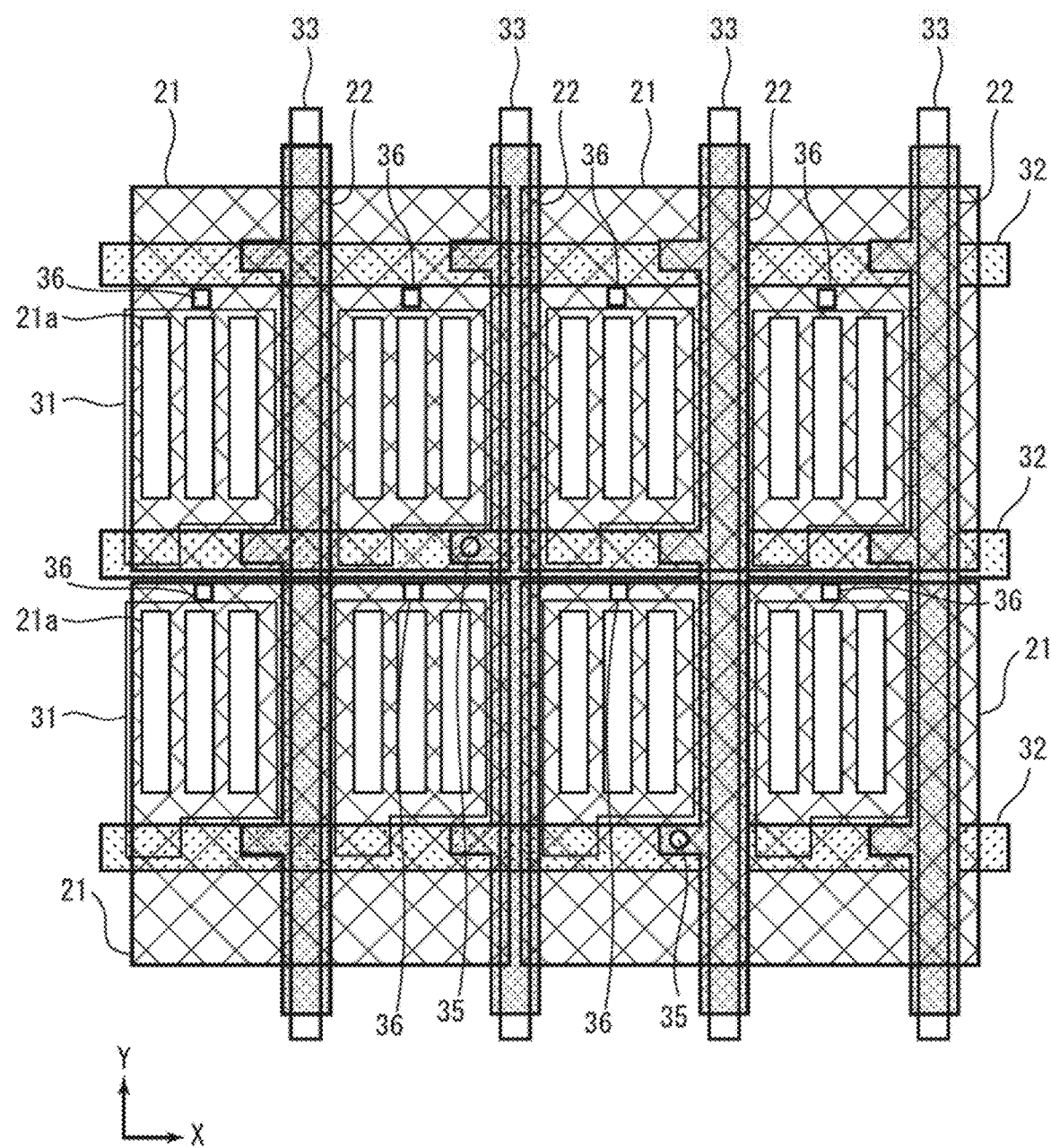
FIG. 3 is an enlarged view schematically illustrating a partial area of the active matrix substrate illustrated in FIG. 1.

FIG. 3 is an enlarged schematic diagram illustrating a part of the area of the active matrix substrate 1. As illustrated in FIG. 3, a plurality of pixel electrodes 31 are arranged in matrix. Further, though the illustration is omitted in FIG. 3, thin film transistors (TFTs) as display control elements (switching elements) are also arranged in matrix in correspondence to the pixel electrodes 31, respectively. The counter electrodes 21 are provided with a plurality of slits 21a.

Around the pixel electrodes 31, the gate lines 32 and the source lines 33 are provided. The gate line 32 extends in the X axis direction, and a plurality of the same are arrayed at predetermined intervals in the Y axis direction. The source line 33 extends in the Y axis direction, and a plurality of the same are arrayed at predetermined intervals in the X axis direction. In other words, the gate lines 32 and the source lines 33 are formed in a lattice form, and the pixel electrodes 31 are provided in the areas defined by the gate lines 32 and the source lines 33, respectively. The gate electrode of each TFT described above is connected with the gate line 32, either the source electrode or the drain electrode thereof is connected with the source line 33, and the other one is connected with the pixel electrode 31.

On the counter substrate 2 (see FIG. 1), color filter of three colors of R, G, and B are provided so as to correspond to the pixel electrodes 31, respectively. With this configuration, each of the pixel electrodes 31 functions as a subpixel of any one of the colors of R, G, and B.

As illustrated in FIG. 3, the signal lines 22 extending in the Y axis direction are arranged so as to partially overlap, in the normal line direction of the active matrix substrate 1, with the source lines 33 extending in the Y axis direction. More specifically, the signal lines 22 are provided in a layer upper with respect to the source lines 33, and the signal lines 22 and the source lines 33 partially overlap with each other when viewed in a plan view.

In FIG. 3, white circles 35 indicate portions at which the counter electrodes 21 and the signal line 22 are connected with each other. Further, rectangles 36 indicate portions at which the counter electrodes 21 and auxiliary capacitance electrodes to be described below, provided in a layer lower with respect to the counter electrodes 21, are connected with each other.

Figure 4A:
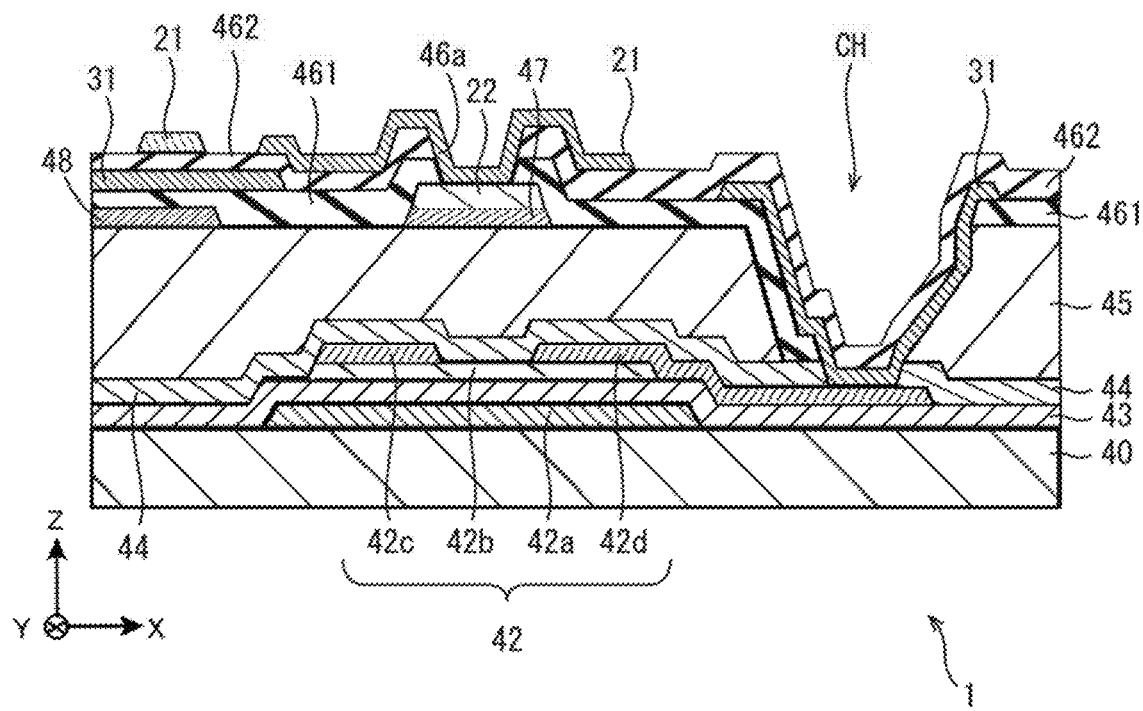
FIG. 4A is a schematic cross-sectional view of the active matrix substrate in a signal line connection area.
Figure 4B:
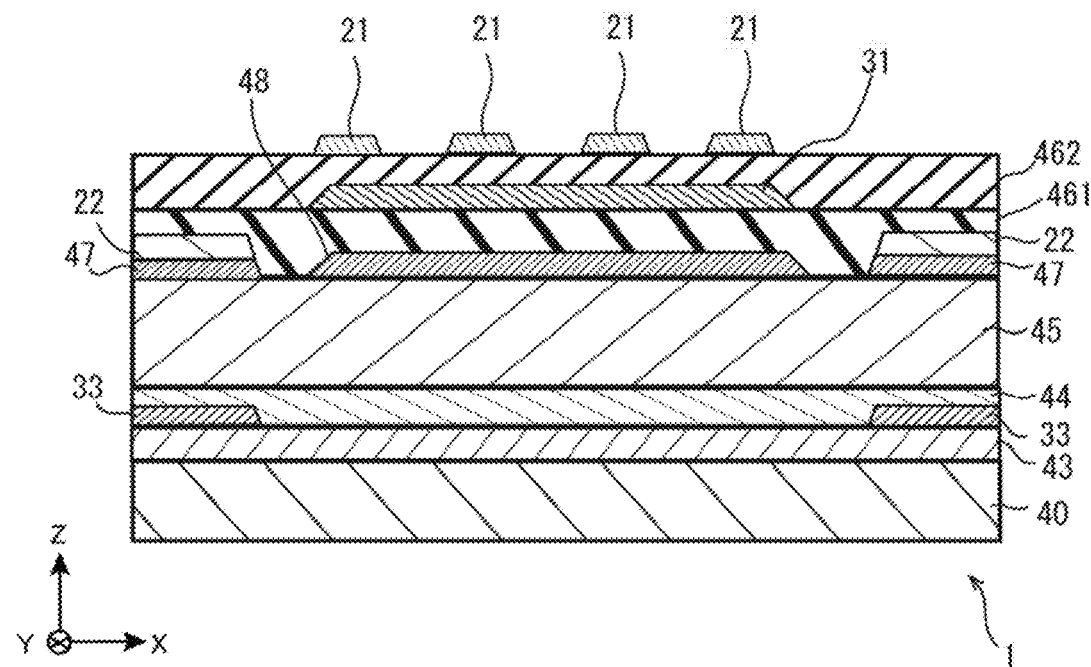
FIG. 4B is a schematic cross-sectional view of the active matrix substrate in an other area than the signal line connection area.

FIG. 4A is a cross-sectional view of the active matrix substrate 1, in an area thereof where the TFT is arranged, and the signal line 22 is connected with the counter electrode 21 (this area is hereinafter referred to as a "signal line connection area"). Further, FIG. 4B is a cross-sectional view of the active matrix substrate 1, in an area thereof where no TFT is arranged, the area being other than the signal line connection area.

As illustrated in FIG. 4A, a TFT 42 is provided on a glass substrate 40. The TFT 42 includes a gate electrode 42a, a semiconductor film 42b, a source electrode 42c, and a drain electrode 42d.

The gate electrode 42a of the TFT 42 is formed on the glass substrate 40. The gate electrode 42a is formed with, for example, a laminate film of titanium (Ti) and copper (Cu). The gate insulating film 43 is formed so as to cover the gate electrode 42a. The gate insulating film 43 is formed with, for example, silicon nitride (SiNx), silicon dioxide ($SiO_2$), or the like.

On the gate insulating film 43, a semiconductor film 42b is formed. The semiconductor film 42b is, for example, an oxide semiconductor film, and may contain at least one metal element among In, Ga, and Zn. In the present embodiment, the semiconductor film 42b contains, for example, In—Ga—Zn—O-based semiconductor. Here, the In—Ga—Zn—O-based semiconductor is a ternary oxide of indium (In), gallium (Ga), and zinc (Zn), in which the ratio (composition ratio) of In, Ga, and Zn is not limited particularly, and examples of the ratio include In:Ga:Zn=2:2:1, In:Ga:Zn=1:1:1, and In:Ga:Zn=1:1:2.

The source electrode 42c and the drain electrode 42d are provided on the semiconductor film 42b so as to be positioned apart from each other. The source electrode 42c and the drain electrode 42d are formed with, for example, laminate films made of titanium (Ti) and copper (Cu).

An inorganic insulating film 44 is formed so as to cover the source electrode 42c and the drain electrode 42d. The inorganic insulating film 44 is made of, for example, silicon nitride ($SiN_x$) or silicon dioxide ($SiO_2$).

On the inorganic insulating film 44, an organic insulating film (flattening film) 45 is formed. The organic insulating film 45 is made of, for example, an acryl-based organic resin material such as polymethyl methacrylate resin (PMMA). By forming the organic insulating film (flattening film) 45, disturbance of the alignment of liquid crystal molecules caused by unevenness in portions where TFTs are formed can be reduced, and further, parasitic capacitances between the gate lines 32 or the source lines 33 and the pixel electrodes 31 can be reduced. The organic insulating film 45, however, can be omitted.

Further, as illustrated in FIGS. 4A and 4B, auxiliary capacitance electrodes 48 are formed, and a conductive film 47 and signal lines 22 are laminated, on the organic insulating film 45. The conductive film 47 and the auxiliary capacitance electrode 48 are transparent electrodes made of a material such as Indium tin oxide (ITO), zinc oxide (ZnO), indium zinc oxide (IZO), indium gallium zinc oxide (IGZO), indium tin zinc oxide, (ITZO), or the like. With the conductive film 47 being arranged under the signal lines 22, the adhesiveness of the signal lines 22 with the organic insulating film 45 is improved. Further, the resistance of the signal lines 22 can be reduced.

The signal lines 22 are made of, for example, any one of copper (Cu), titanium (Ti), molybdenum (Mo), aluminum (Al), magnesium (Mg), cobalt (Co), chromium (Cr), tungsten (W), or a mixture of these. As a material for the signal lines 22, a material having a smaller specific resistance than that of the conductive film 47 is particularly preferable.

Further, on the organic insulating film 45, a first insulating film 461 (a first insulating layer) is formed. The first insulating film 461 is formed so as to cover the signal lines 22 and the auxiliary capacitance electrodes 48. The first insulating film 461 is made of, for example, silicon nitride (SiNx), or silicon dioxide ($SiO_2$).

On the first insulating film 461, the pixel electrodes 31 are formed, each of which is formed at a position that is opposed to the auxiliary capacitance electrode 48, and does not overlap with the signal lines 22. The pixel electrode 31 is a transparent electrode made of a material such as ITO, ZnO, IZO, IGZO. ITZO, or the like.

Still further, on the first insulating film 461 and the pixel electrodes 31, a second insulating film 462 (second insulating layer) is formed. The second insulating film 462 is made of, for example, silicon nitride (SiNx), silicon dioxide (SiO$_2$), or the like. In the signal line connection area, as illustrated in the drawing, an opening 46a is formed in the first insulating film 461 and the second insulating film 462; the opening 46a, however, is not provided in any area where the signal line 22 and the counter electrode 21 are not connected. In other words, in a portion where the signal line 22 is not connected with the counter electrode 21 and overlaps with another counter electrode 21, two insulating films, i.e., the first insulating film 461 and the second insulating film 462, are provided between the another counter electrode 21 and the signal line 22.

Figure 4C:
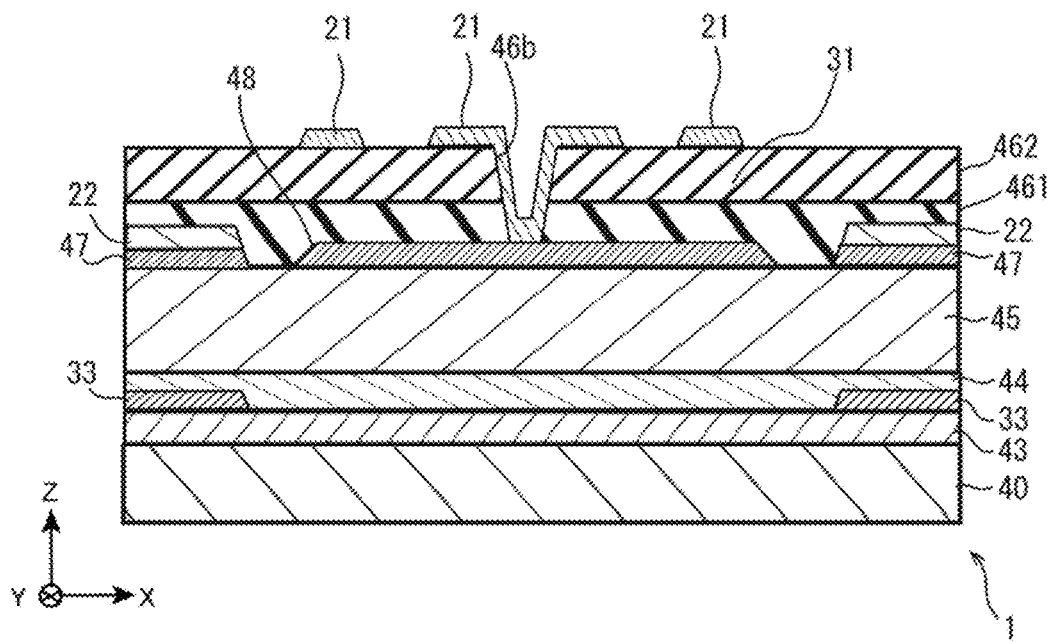
FIG. 4C is a schematic cross-sectional view of the active matrix substrate in an other area than the signal line connection area.

On the second insulating film 462, the counter electrodes 21 are formed. The counter electrode 21 is a transparent electrode made of a material such as ITO, ZnO, IZO, IGZO. ITZO, or the like. As illustrated in FIG. 4A, the counter electrode 21 is in contact with the signal line 22 at the opening 46a in the signal line connection area. Further, the counter electrode 21 is in contact with the auxiliary capacitance electrode 48 at the position of the rectangle 36 illustrated in FIG. 3. More specifically, as illustrated in FIG. 4C, on the auxiliary capacitance electrode 48, the opening 46b piercing through the first insulating film 461 and the second insulating film 462 is provided, and the counter electrode 21 and the auxiliary capacitance electrode 48 are connected with each other at the opening 46b.

During the controlling operation for displaying an image, a uniform voltage is applied to the counter electrodes 21 under the control of the controller 20 (see FIG. 2) through the signal lines 22, and the auxiliary capacitance electrodes 48 are controlled so as to have the same potential as that of the counter electrodes 21. Further, during the controlling operation for detecting a touch position, a touch driving signal voltage is applied to the counter electrodes 21 under the control of the controller 20 through the signal lines 22, and the auxiliary capacitance electrodes 48 are controlled so as to have the same potential as that of the counter electrodes 21.

Referring back to FIG. 4A, an opening CH is formed in the inorganic insulating film 44 and the organic insulating film 45. The pixel electrode 31 is in contact with the drain electrode 42d of the TFT 42 through the opening CH.

Figure 5A:
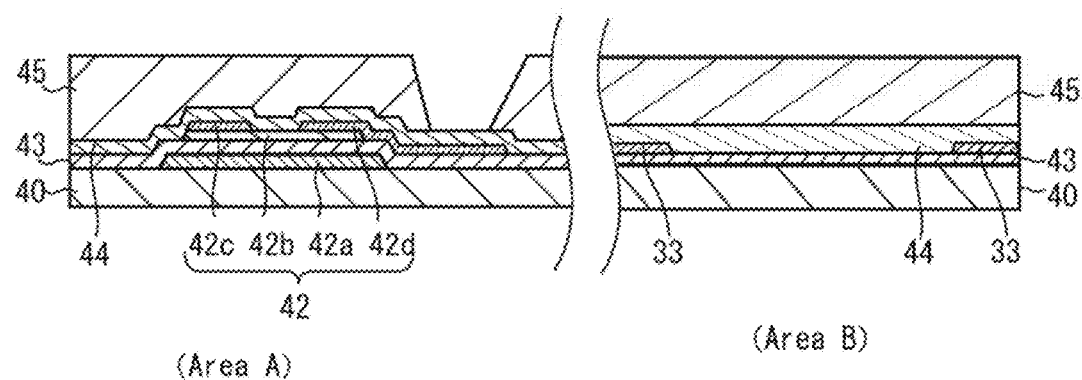
FIG. 5A is a cross-sectional view for explaining a method for producing the active matrix substrate illustrated in FIG. 1, the view illustrating a state in which a TFT, a source line, an inorganic insulating film, and an organic insulating film are formed.

Next, the following description describes a method for producing the active matrix substrate 1. FIGS. 5A to 5N are cross-sectional views for explaining a process of producing the active matrix substrate 1 in the present embodiment. In each drawing of FIGS. 5A to 5N, the cross-sectional view on the left regarding an area A illustrates a cross section of an area including the signal line connection area (the white circle 35 in FIG. 3) in the active matrix substrate 1. Further, in each drawing of FIGS. 5A to 5N, the cross-sectional view on the right side regarding an area B illustrates a cross section of a part of the pixel area that includes a part where the counter electrode 21 and the auxiliary capacitance electrode 48 are connected (the rectangle 36 in FIG. 3).

First, on the glass substrate 40, the TFT 42 is formed by a known method. In this example, the source electrode 42c and the source line 33 of the TFT 42 are integrally formed.

FIG. 5A illustrates a state in which the TFT 42 and the source line 33 are formed by a known method on the glass substrate 40, and the inorganic insulating film 44 and the organic insulating film 45 are formed on the same.

Figure 5B:
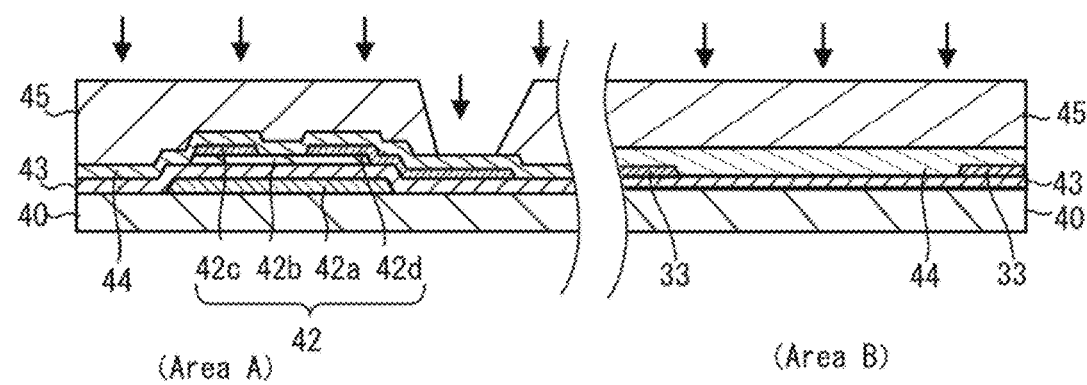
FIG. 5B is a cross-sectional view illustrating a step of performing a plasma treatment with respect to a surface of the active matrix substrate illustrated in FIG. 5A.

In the state illustrated in FIG. 5A, a plasma treatment using nitrogen gas or oxygen gas is performed with respect to an exposed surface (see FIG. 5B). In other words, a plasma treatment is performed with respect to surfaces of the inorganic insulating film 44 and the organic insulating film 45. By performing the plasma treatment, fine unevennesscan be formed on a smooth surface (surface roughening), thereby causing the adhesiveness of a transparent electrode film to be formed in a later step to be improved.

Figure 5C:
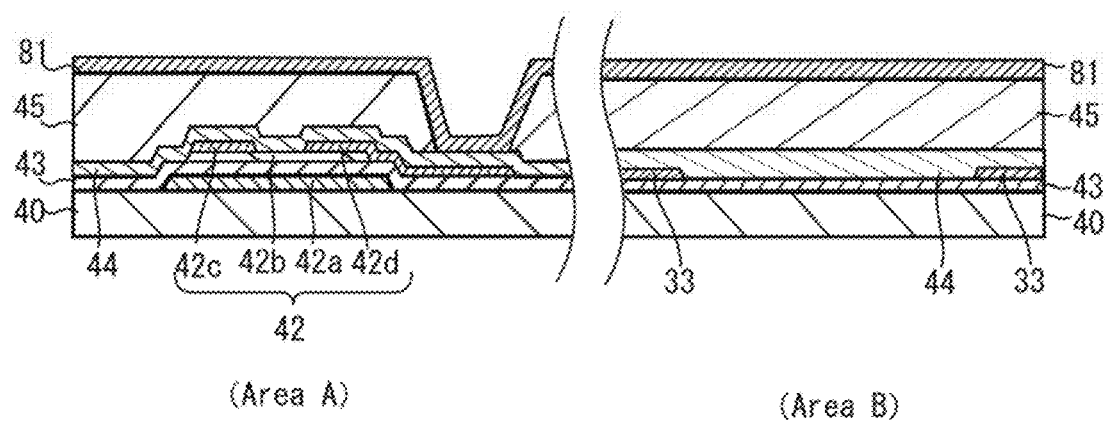
FIG. 5C is a cross-sectional view illustrating a step of forming a transparent electrode film on the organic insulating film illustrated in FIG. 5B.
Figure 5D:
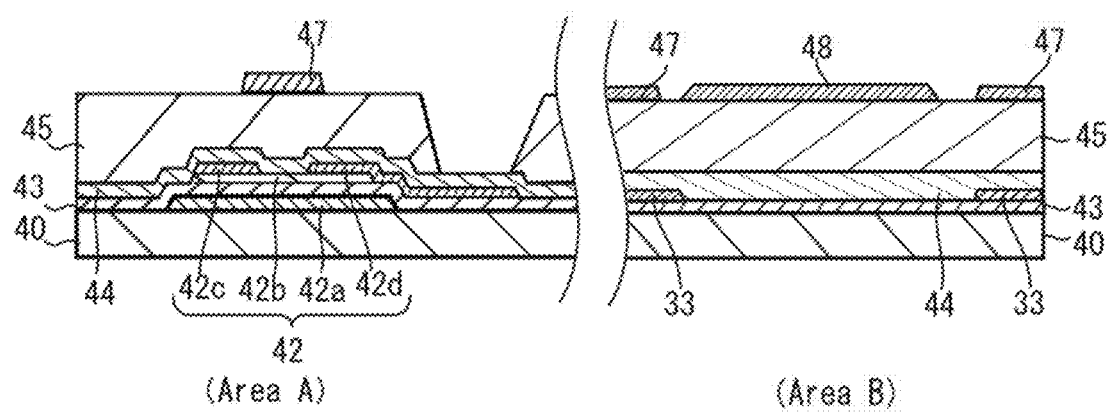
FIG. 5D is a cross-sectional view illustrating a step of forming a conductive film and an auxiliary capacitance electrode, subsequent to the state illustrated FIG. 5C.

Subsequently, a transparent electrode film 81 is formed on the organic insulating film 45 (see FIG. 5C). The transparent electrode film 81 has a thickness of, for example, 10 nm to 100 nm. Then, the transparent electrode film 81 is patterned by using photolithography and wet etching, whereby the conductive film 47 and the auxiliary capacitance electrode 48 are formed so as to be positioned apart from each other (see FIG. 5D). Edge positions of the auxiliary capacitance electrode 48 are determined according to the driving capability of the TFT 42, and in this example, the edges of the auxiliary capacitance electrode 48 is approximately at the same positions as those of the pixel electrode 31.

Figure 5E:
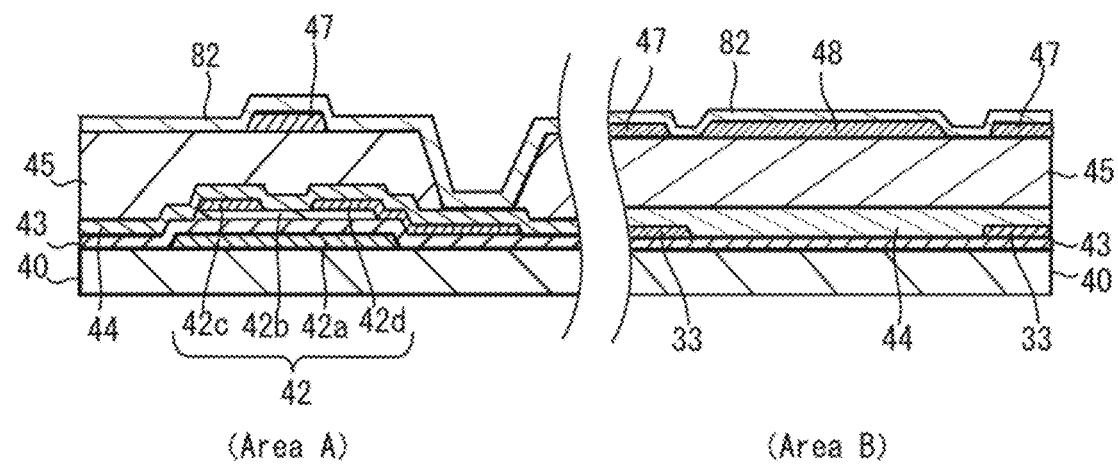
FIG. 5E is a cross-sectional view is a step of forming a mask on the auxiliary capacitance electrode illustrated in FIG. 5D, and then, forming a metal film.

Thereafter, a metal film 82 is formed on the auxiliary capacitance electrode 48 (see FIG. 5E). The metal film 82 has a thickness of, for example, 50 nm to 300 nm.

Figure 5F:
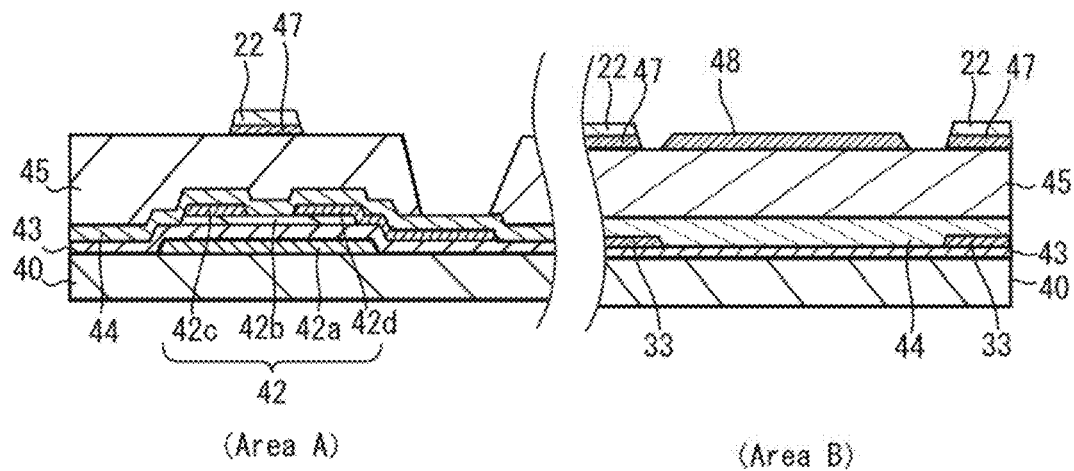
FIG. 5F is a cross-sectional view illustrating a step of forming a signal line, subsequent to the state illustrated in FIG. 5E.

Then, the metal film 82 is patterned by using photolithography and wet etching, whereby the signal line 22 is formed on the conductive film 47 (see FIG. 5F).

Figure 5G:
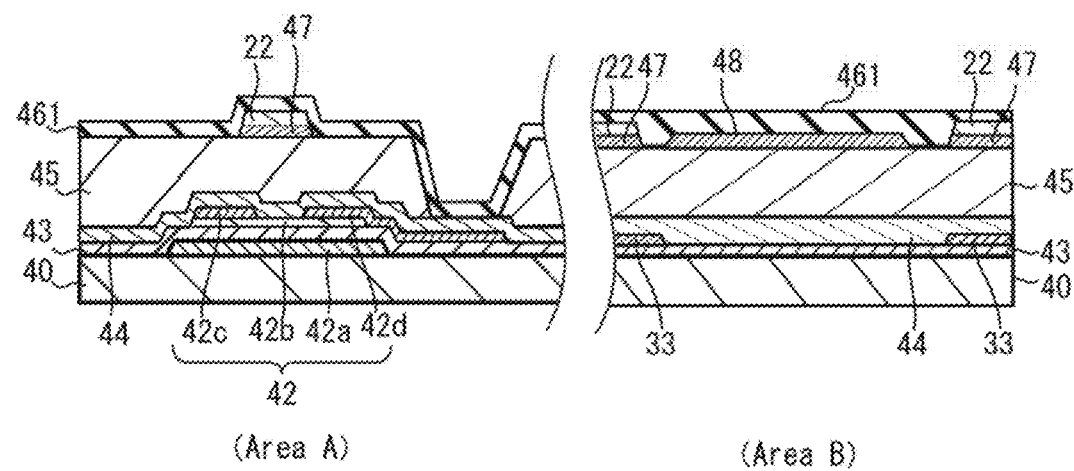
FIG. 5G is a cross-sectional view illustrating a step of forming a first insulating film, in the state illustrated in FIG. 5F.

Next, a first insulating film 461 is formed so as to cover the organic insulating film 45, the auxiliary capacitance electrode 48, and the signal line 22 (see FIG. 5G). The first insulating film 461 has a thickness of, for example, 200 nm to 800 nm.

Figure 5H:
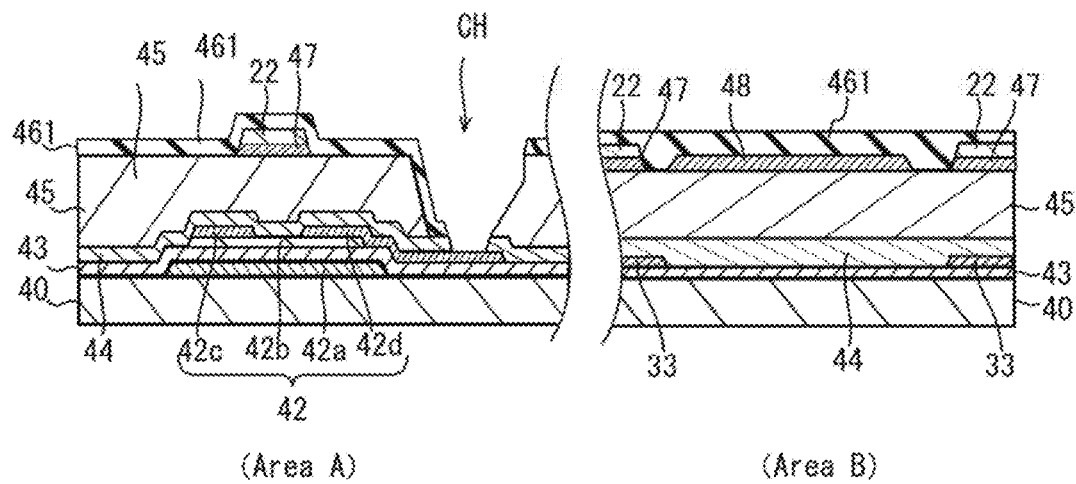
FIG. 5H is a cross-sectional view illustrating a step of forming an opening through which a pixel electrode and a drain electrode of a TFT are connected, in the state illustrated in FIG. 5G.

Subsequently, in a part that overlaps with the drain electrode 42d of the TFT 42, the first insulating film 461 and the inorganic insulating film 44 are patterned by using photolithography and dry etching. This causes a part of the surface of the drain electrode 42d to be exposed, whereby an opening CH for connecting the pixel electrode 31 and the drain electrode 42d of the TFT 42 is formed (see FIG. 5H).

Figure 5I:
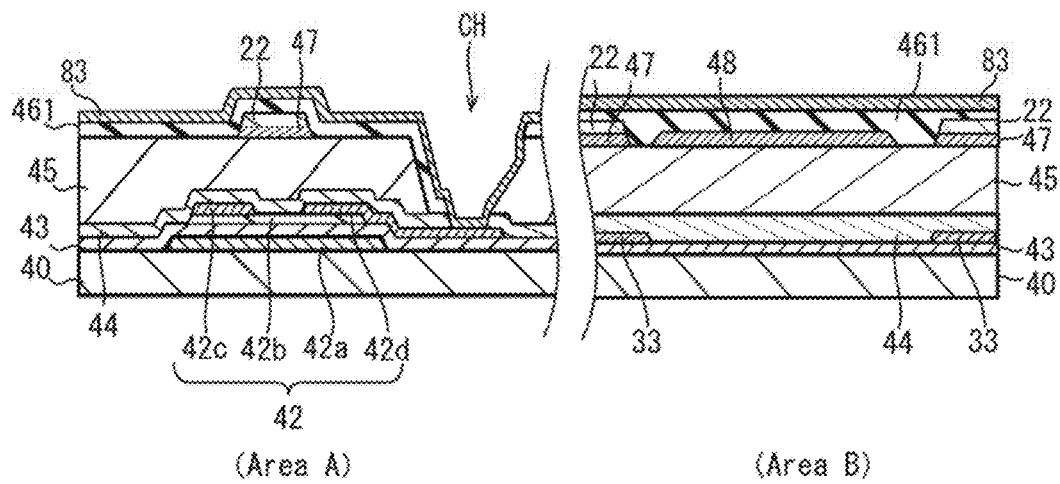
FIG. 5I is a cross-sectional view illustrating a step of forming a transparent electrode film on the first insulating film illustrated in FIG. 5H.
Figure 5J:
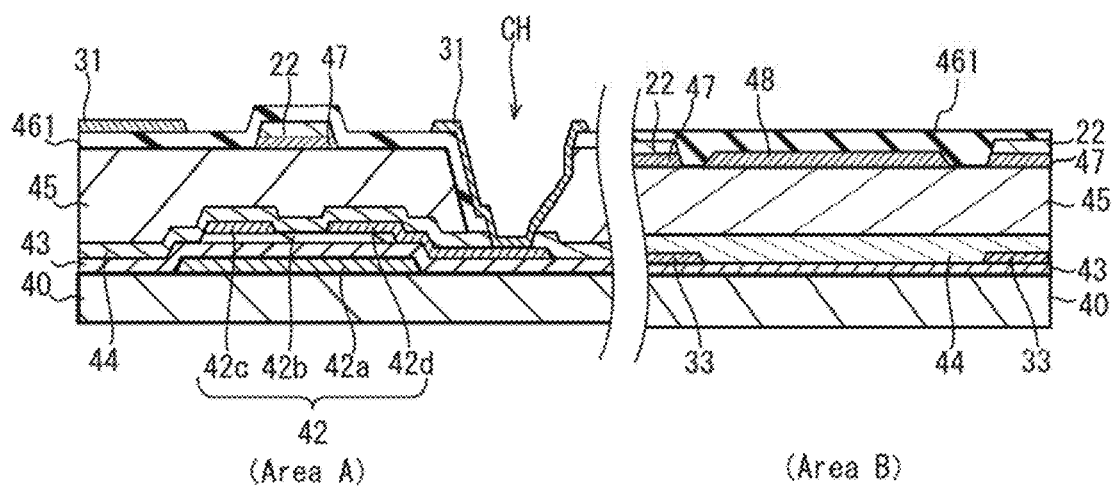
FIG. 5J is a cross-sectional view illustrating a step of forming a pixel electrode connected with the drain electrode, subsequent to the state illustrated in FIG. 5I.

Next, a transparent electrode film 83 is formed so as to cover the first insulating film 461 (see FIG. 5I). Thereafter, the transparent electrode film 83 is patterned by photolithography and wet etching. As a result, the pixel electrode 31 that is connected with the drain electrode 42d at the opening CH is formed (see FIG. 5J).

Figure 5K:
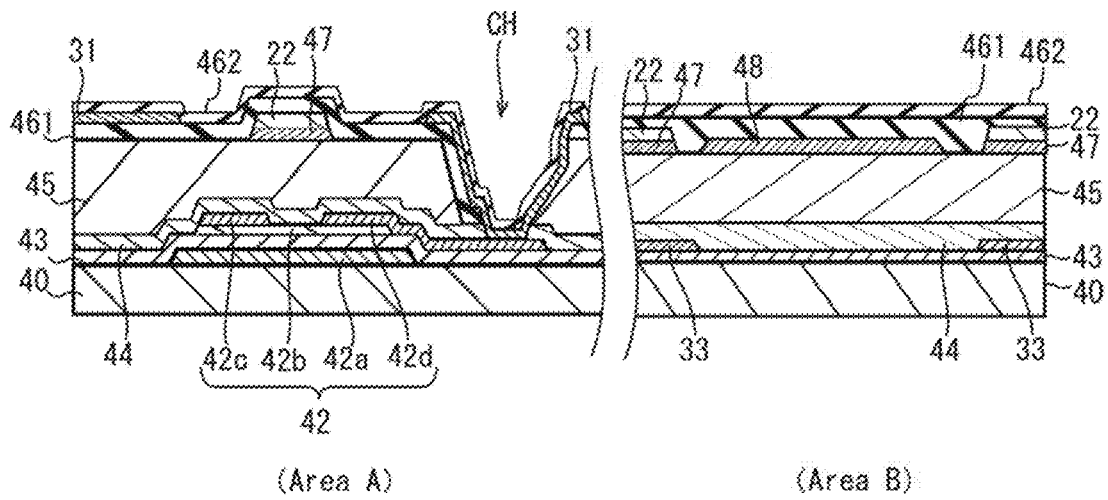
FIG. 5K is a cross-sectional view illustrating a step of forming a second insulating film on the pixel electrode and the first insulating film illustrated in FIG. 5J.
Figure 5L:
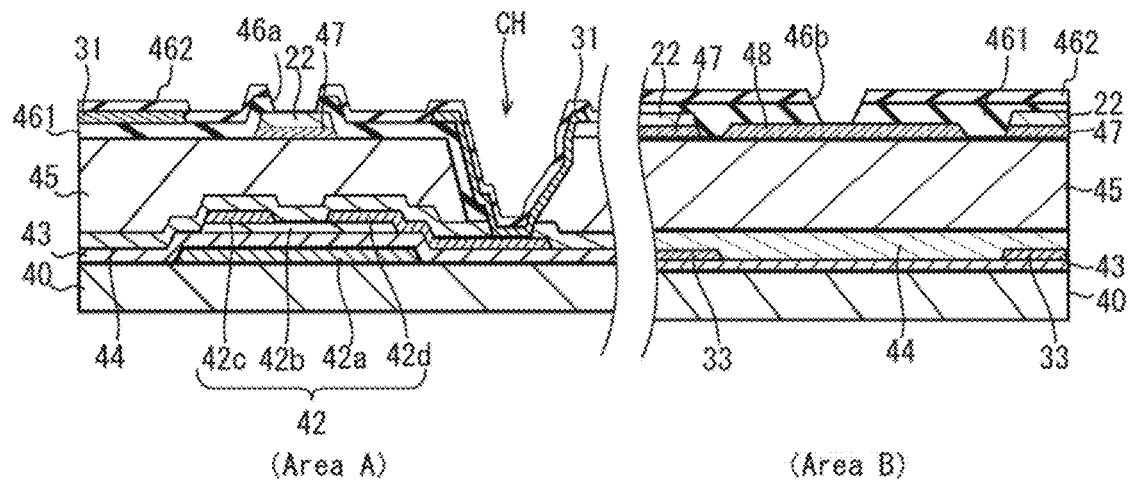
FIG. 5L is a cross-sectional view illustrating a step of forming an opening in the first insulating film and the second insulating film illustrated in FIG. 5K.

Subsequently, a second insulating film 462 is formed so as to cover the pixel electrode 31 and the first insulating film 461 (see FIG. 5K). The second insulating film 462 has a thickness of, for example, 200 nm to 800 nm. In a case where the specific dielectric constant of the first insulating film 461 and that of the second insulating film 462 are approximately equal, the second insulating film 462 may have a thickness smaller than that of the first insulating film 461. After the second insulating film 462 is formed, the first insulating film 461 and the second insulating film 462 are patterned by using photolithography and dry etching. This causes an opening 46a and an opening 46b to be formed in the first insulating film 461 and the second insulating film 462 in the area A and the area B, thereby causing the surface of the signal line 22 and the surface of the auxiliary capacitance electrode 48 to be partially exposed (see FIG. 5L). The opening 46a and the opening 46b, however, do not have to be provided in every pixel. At least one opening 46a and one opening 46b may be provided per one counter electrode 21; as a greater number of the openings are provided, the resistance of each counter electrode 21 is smaller, and the touch position detection accuracy can be improved.

Figure 5M:
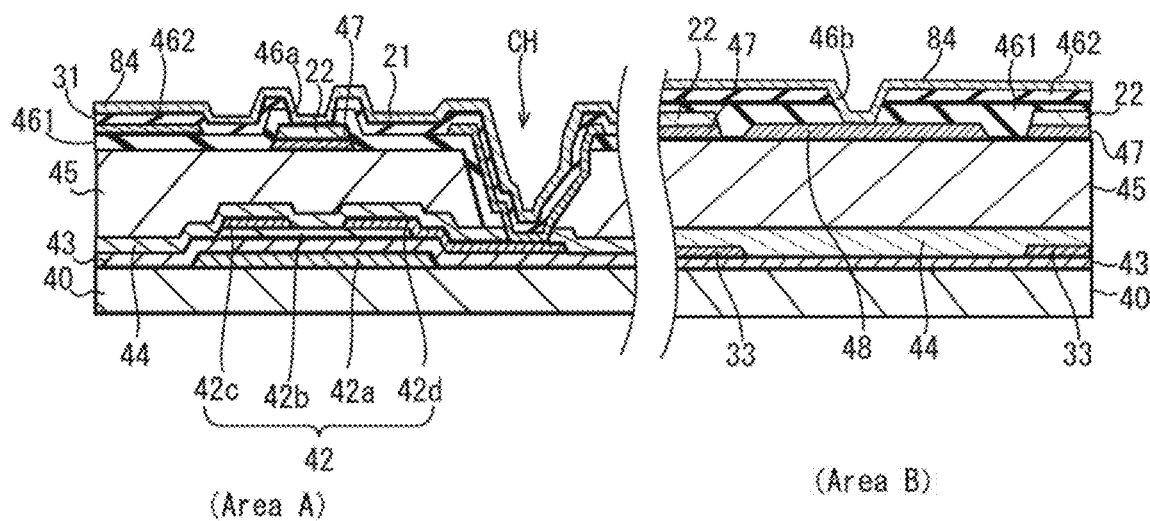
FIG. 5M is a cross-sectional view illustrating a step of forming a transparent electrode film on the second insulating film illustrated in FIG. 5L.
Figure 5N:
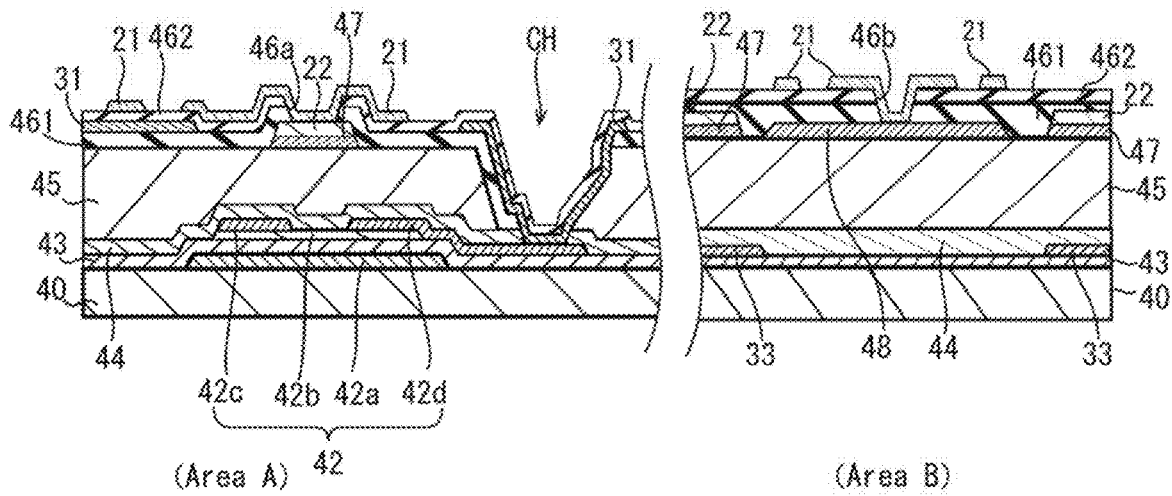
FIG. 5N is a cross-sectional view illustrating a step of forming a counter electrode, subsequent to the state illustrated in FIG. 5M.

Next, the transparent electrode film 84 is formed on the second insulating film 462 so as to be in contact with the signal line 22 and the auxiliary capacitance electrode 48 (see FIG. 5M). Then, the transparent electrode film 84 is patterned by using photolithography and wet etching. As a result, the counter electrode 21 having slits that allow a horizontal electric field to be formed between the counter electrode 21 and the pixel electrode 31 is formed, and each of the signal line 22 and the auxiliary capacitance electrode 48 are connected with the counter electrode 21 in the area A and the area B (see FIG. 5N).

In Embodiment 1 described above, the pixel electrode 31 is interposed between the auxiliary capacitance electrode 48 and the counter electrode 21, with the first insulating film 461 and the second insulating film 462 being provided therebetween, which allows the capacitance of the pixel to be increased as compared with a case where only the counter electrode 21 is provided. Further, the auxiliary capacitance electrode 48 has a width approximately equal to the width of the pixel electrode 31, and is positioned apart from the conductive film 47. The positions of the edges of the auxiliary capacitance electrode 48 are determined according to the driving capability of the TFT 42. The driving capability of the TFT 42 means a current value between the source electrode 42c and the drain electrode 42d in a state where the TFT 42 is ON, which is also referred to as a charging capability. In a case where the auxiliary capacitance electrode 48 and the conductive film 47 are not positioned apart from each other, the capacitance between the pixel electrode 31 and the auxiliary capacitance electrode 48 increases to a level higher than required, which makes it necessary to increase the driving capability of the TFT 42. Examples of means for increasing the driving capability of the TFT 42 include increasing the width of the channel part of the TFT 42 (the width of the source electrode 42c or the drain electrode 42d), and increasing the gate voltage for turning the TFT 42 ON. In the former case, the size of the TFT 42 increases, which causes the aperture ratio in the pixel portion decreases, and besides, the parasitic capacitance between the gate electrode 42a and the drain electrode 42c of the TFT 42 increases; as a result, display defects such as flickering tend to easily occur. In the latter case, the electric power consumption increases, and besides, the voltage difference between the ON state and the OFF state of the TFT 42 increases; as a result, flickering caused by a parasitic capacitance between the gate electrode 42a and the drain electrode 42c of the TFT 42 tends to easily occur. In Embodiment 1, since the edges of the auxiliary capacitance electrode 48 are determined according to the driving capability of the TFT 42, a pixel capacitance in accordance with the driving capability of the TFT 42 can be obtained.

Figure 6A:
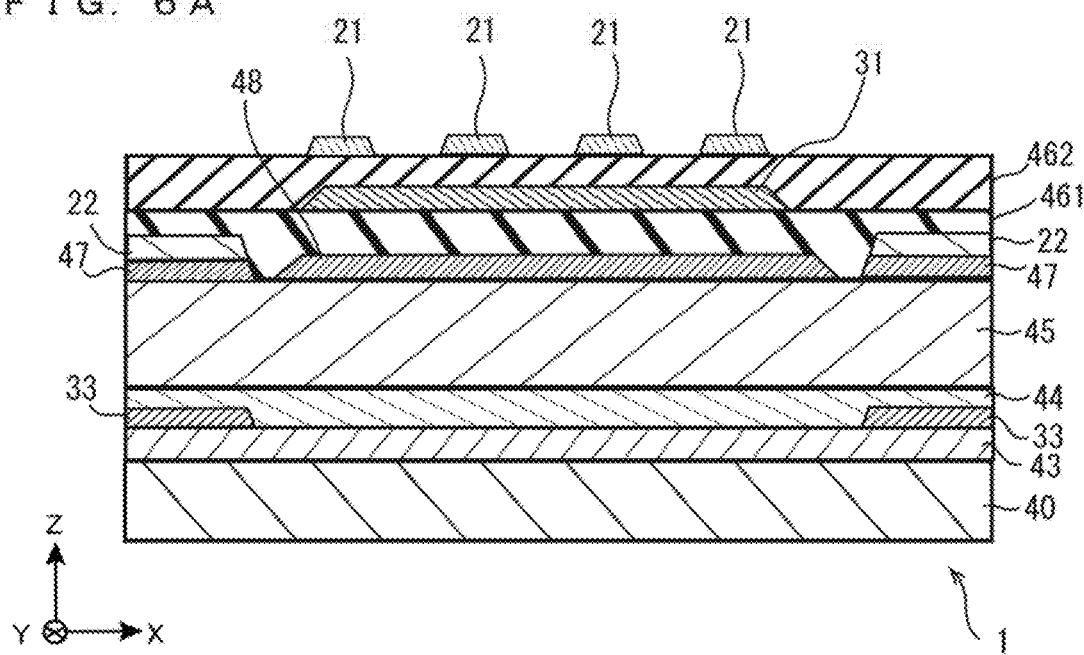
FIG. 6A is a cross-sectional view illustrating another exemplary configuration of the auxiliary capacitance electrode in Embodiment 1.

Embodiment 1 is described with reference to an example in which the edges of the auxiliary capacitance electrode 48 are positioned approximately at the same positions as the edges of the pixel electrode 31, but the configuration may be as follows. As illustrated in FIG. 6A, the auxiliary capacitance electrode 48 has edges closer to the signal line 22 than to the pixel electrode 31 so as to interrupt the electric field between the pixel electrode 31 and the source line 33. Such a configuration makes it possible to decrease a parasitic capacitance generated between the pixel electrode 31 and the source line 33. Consequently, when an image is written in the pixel, voltage pull-in due to the capacitive coupling of the pixel electrode 31 and the source line 33 becomes smaller, whereby display defects such as shadowing and the like can be reduced.

In such a configuration, however, since the auxiliary capacitance electrode 48 is closer to the signal line 22, a parasitic capacitance between the auxiliary capacitance electrode 48 and the signal line 22 increases. If a parasitic capacitance is large between a certain signal line 22, and an auxiliary capacitance electrode 48 provided in correspondence to a counter electrode 21 other than the counter electrode 21 to which the foregoing signal line 22 is connected, the touch position detection accuracy tends to decrease. The size of the auxiliary capacitance electrode 48 is therefore set with the capacitance that composes each pixel capacitance being taken into consideration.

Figure 6B:
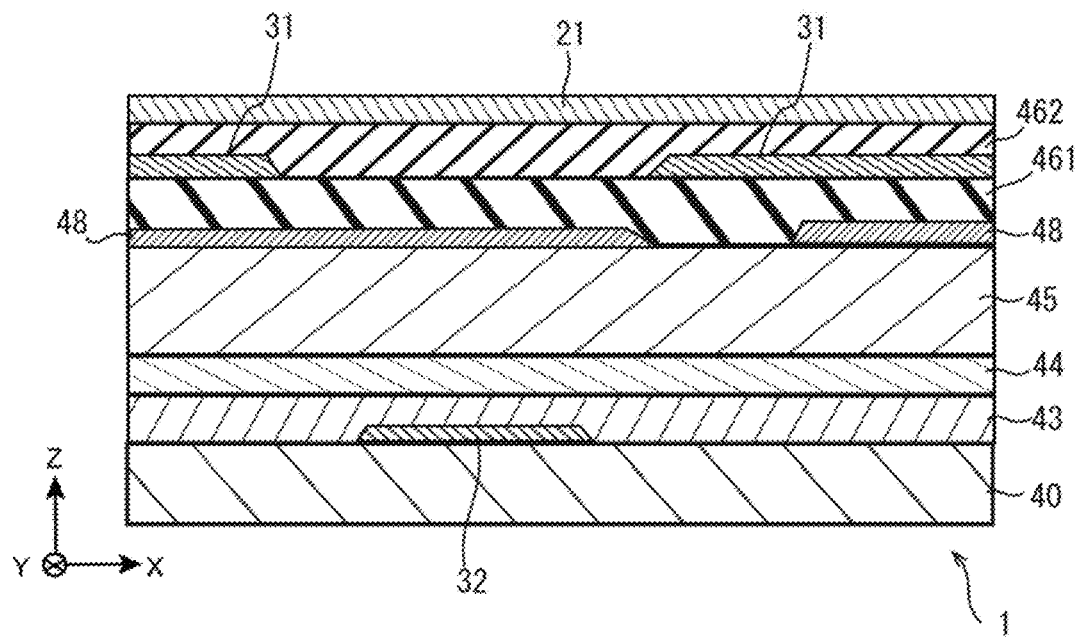
FIG. 6B is a cross-sectional view illustrating still another exemplary configuration of the auxiliary capacitance electrode in Embodiment 1.

Further, as illustrated in FIG. 6B, the auxiliary capacitance electrode 48 may be configured so that a part of the auxiliary capacitance electrode 48 overlaps with the gate line 32. In such a configuration, an electric field generated between the pixel electrode 31 and the gate line 32 is interrupted by the auxiliary capacitance electrode 48. Consequently, the parasitic capacitance between the pixel electrode 31 and the gate line 32 is reduced, which causes the voltage pull-in due to the capacitive coupling between the pixel electrode 31 and the gate line 32 to decrease, thereby making it possible to reduce display defects such as luminance unevenness in boundary between segments of the counter electrodes 21 and flickering.

Embodiment 2

Figure 7:
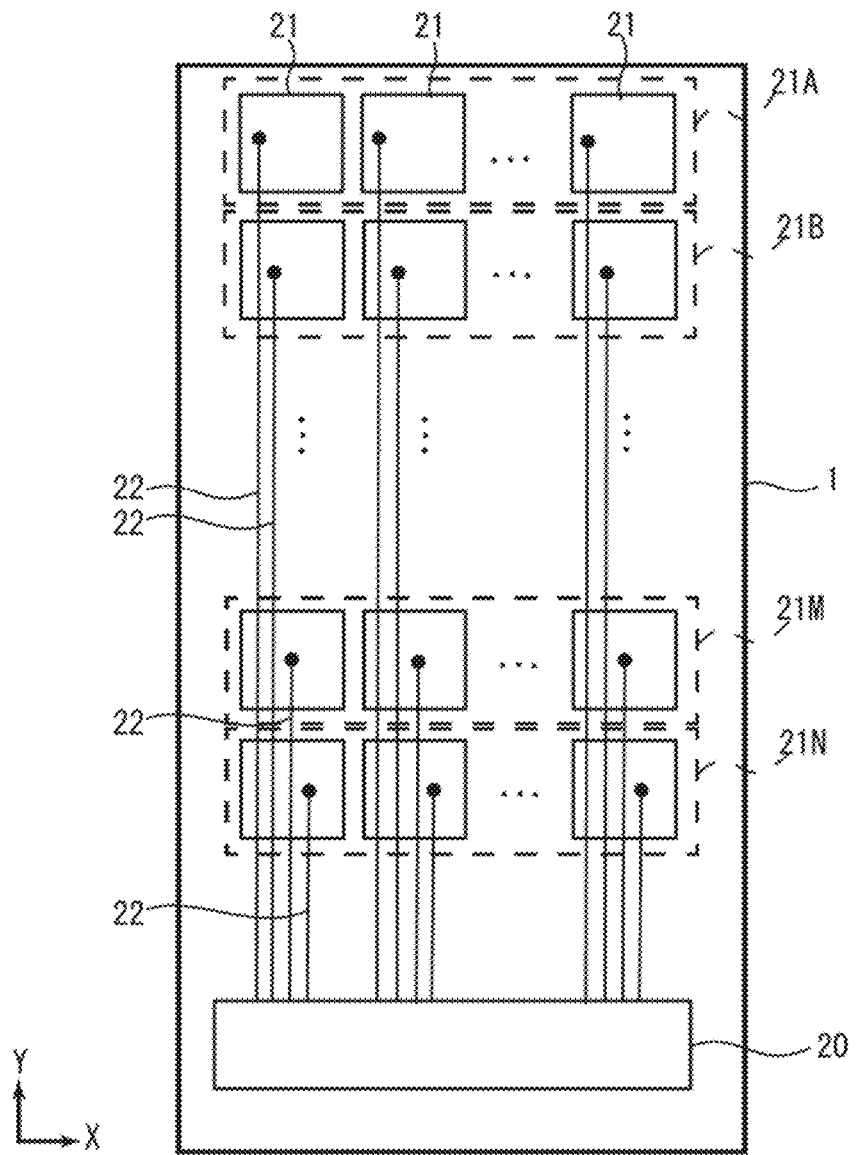
FIG. 7 is a schematic plan view illustrating an arrangement of the counter electrodes in the active matrix substrate.

In the active matrix substrate 1 in Embodiment 1, the counter electrodes 21 are arrayed in the X axis direction and the Y axis direction as illustrated in FIG. 7. In other words, the counter electrodes 21 are arrayed in the extending directions of the gate lines 32 and the source lines 33 illustrated in FIG. 3. In FIG. 7, areas corresponding to the rows in which the counter electrodes 21 are arranged are assumed to be "segments 21A to 21N".

The counter electrodes 21 are arranged so as to be divided into the segments 21A to 21N. When a signal is written in a certain pixel (the TFT of the pixels is turned ON so that the pixel capacitor is charged), influences received from a pixel adjacent thereto in the Y axis direction is different between the vicinities of boundaries of the segment and the center part of the segment in some cases, in which voltages applies to the liquid crystal layer 3 are different. The following description describes this phenomenon in detail.

For example, in some cases, in order to make up for the insufficient charging for each pixel, a preliminary charging (hereinafter referred to as pre-charging) period is provided before a regular charging (hereinafter referred to as main charging) period.

Figure 8A:
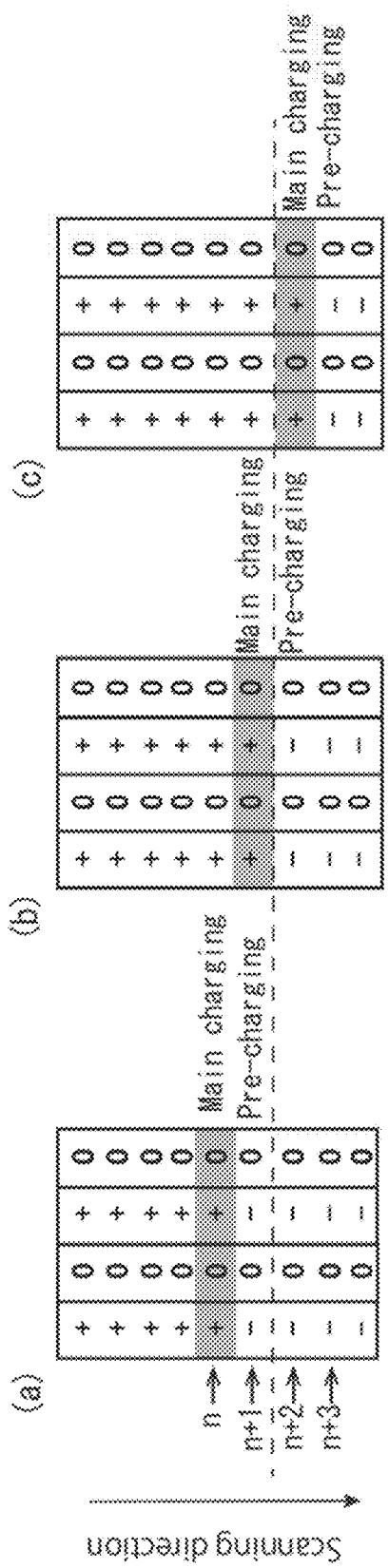
FIG. 8A is a diagram for explaining a cause for luminance difference occurring to pixels at a boundary of segments in Embodiment 2, illustrating transition of charging states at respective pixels.

(a) to (c) of FIG. 8A are transition diagrams illustrating charging states of each pixel in a case where column reverse driving is performed. "+", "−", and "0" indicate charging voltages (polarities or voltage values) of the pixel. Further, in this example, as illustrated in (a) to (c) in FIG. 8A, the gate lines 32 of the pixels (see FIG. 3) are scanned in a direction from the top to the bottom of the drawing, and the main charge period for each pixel overlaps with the pre-charging period for the pixel adjacent thereto in the scanning direction. Still further, the boundary between the pixels in the (n+1)th row and the pixels in the (n+2)th row is a boundary between segments of the counter electrodes 21. In other words, the counter electrodes 21 of the same segment are arranged in correspondence to the pixels in the n'th row and the (n+1)th row, and the counter electrodes 21 of a segment different from the above-described segment are arranged in correspondence to the pixels in the (n+2)th row and the (n+3)th row.

FIG. 8B illustrates voltage waveforms when the pixels in the n'th row, the (n+1)th row, and the (n+2)th row illustrated in (a) to (c) of FIG. 8A are charged. In FIG. 8B, the waveform denoted by "Wg" is a voltage waveform of the gate line 32, the waveform denoted by "Wc" is an ideal voltage waveform of the counter electrode 21. Further, the waveform denoted by "Wh" is an actual voltage waveform of the counter electrode 21, and the waveform denoted by "Wp" is a voltage waveform of the pixel.

As illustrated in FIG. 8B, the voltage waveform Wh of the counter electrode 21 in the n'th row is affected by the pre-charging of the pixel in the n'th row, and is deviated from the ideal voltage waveform We of the counter electrode 21. More specifically, it rises once, then, falls again in such a manner that it approaches to the ideal voltage waveform We of the counter electrode 21. As illustrated in (a) of FIG. 8A, since the main charge period for the pixels in the n'th row and the pre-charging period for the pixels in the (n+1)th row overlap, the pre-charging period ta for the pixels in the (n+1)th row starts simultaneously with the main charge period tb for the pixels in the n'th row. Since the same counter electrodes 21 commonly correspond to the pixels in the n'th row and the pixels in the (n+1)th row, the voltage waveform Wh of the counter electrodes 21 of the n'th row rises again, affected by fluctuations of the potentials of the counter electrodes 21 due to the pre-charging of the pixels in the (n+1)th row, and then, falls again in such a manner that it approaches to the ideal voltage waveform We of the counter electrodes 21. The voltage applied to the liquid crystal layer 3 when the main charge period tb ends is assumed to be "Vlc".

The voltage waveform Wh of the counter electrodes 21 in the (n+1)th row, pixels in the (n+1)th row is affected by pre-charging, thereby being deviated from the ideal voltage waveform We of the counter electrodes 21. More specifically, it rises once, then, falls again in such a manner that it approaches to the ideal voltage waveform We of the counter electrode 21. As illustrated in (b) of FIG. 8A, since the main charge period for the pixels in the (n+1)th row and the pre-charging period for the pixels in the (n+2)th row overlap, the pre-charging period for the pixels in the (n+2)th row ta starts simultaneously with the main charge period for the pixels in the (n+1)th row tb. Here, the voltage waveform Wh of the counter electrodes 21 in the (n+1)th row is not affected by the pre-charging of the pixels in the (n+2)th row. The counter electrodes 21 corresponding to the pixels in the (n+1)th row, and the counter electrodes 21 corresponding to the pixels in the (n+2)th row are arranged in different segments, respectively, and are separated from each other. The pixels in the counter electrodes 21 in the (n+1)th row, therefore, do not have potential fluctuations due to pre-charging of the pixels in the (n+2)th row. In other words, as described above, during the pre-charging period for the (n+1)th row, the voltage waveform Wh of the counter electrode 21, which once rises, falls again in such a manner that it approaches to the ideal voltage waveform We of the counter electrodes 21. The main charge period for the (n+1)th row is allocated for the period while the voltage waveform Wh of the counter electrode 21 approaches the ideal voltage waveform We of the counter electrode 21. The voltage waveform Wh of the counter electrode 21 when the main charge period tb for the (n+1)th row ends is therefore different in some cases from the voltage Wh of the counter electrode 21 when the main charge period tb for the n'th row ends. In this case, the voltage Vlc applied to the liquid crystal layer 3 when the main charge period tb for the pixels in the (n+1)th row ends is greater than the voltage Vlc applied to the liquid crystal layer 3 corresponding to the pixels in the n'th row.

Likewise, as illustrated in (c) of FIG. 8A, the main charge period for the pixels in the (n+2)th row, and the pre-charging period for the pixels in the (n+3)th row overlap, and the same counter electrodes 21 are commonly arranged in correspondence to the pixels in the (n+2)th row and the (n+3)th row. The pixels in the (n+2)th row, therefore, are affected by the pre-charging of the pixels in the (n+3)th row during the main charge period tb for the pixels in the (n+2)th row. In other words, the voltage waveform Wh of the counter electrodes 21 corresponding to the pixels in the (n+2)th row rises, and as is the case with the pixels in the n'th row, the voltage of the pixels applied to the liquid crystal layer 3 decreases. In this example, therefore, luminance difference occurs to between the pixels in the n'th row and the pixels in the (n*1)th row, as well as between the pixels in the (n+1)th row and the pixels in the (n+2)th row.

In other words, in the pixels that are adjacent in the scanning direction and to which the same counter electrodes 21 are commonly arranged, the pixels that are subjected to main charging earlier are affected, during this main charging, by pre-charging for the other pixels, and the voltages applied to the liquid crystal layer 3 decrease. On the other hand, in a case of the pixels that correspond to different counter electrodes 21 even though being adjacent in the scanning direction, the pixels that are subjected to main charging earlier are not affected, during this main charge, by pre-charging for the other pixels. Consequently, luminance differences occur to between the pixels in the vicinities of the boundaries between the segments. The following description describes a configuration of the active matrix substrate in the present embodiment that makes it possible to reduce luminance differences in the pixels in the vicinities of the boundaries between the segments, as compared with Embodiment 1.

In Embodiment 1, for each pixel, the auxiliary capacitance electrode 48 and the counter electrode 21 are connected; in the present embodiment, the auxiliary capacitance electrode 48 and the counter electrode 21 are not electrically connected, but are separated from each other. Further, only the counter electrode 21 is connected with the signal line 22, and the auxiliary capacitance electrode 48 is continuously arranged over the segments 21A to 21N.

The auxiliary capacitance electrode 48 is not connected with the signal line 22, but under the control by the controller 20 (see FIG. 2), a predetermined voltage is applied thereto during the controlling operation for displaying an image, and a capacitor is formed between the auxiliary capacitance electrode 48 and the pixel electrode 31. Further, during the controlling operation for detecting a touch position, the auxiliary capacitance electrode 48 is controlled so as to be in an electrically floating state. As the auxiliary capacitance electrode 48 is in a floating state during the controlling operation for detecting a touch position, charges are held between the pixel electrode 31 and the auxiliary capacitance electrode 48.

The auxiliary capacitance electrode 48, therefore, is not a cause of malfunctions when a touch position is detected, and with the charges held between the auxiliary capacitance electrode 48 and the pixel electrode 31, the difference between voltages applied to the liquid crystal layer 3, which occurs due to fluctuations of the voltages of the counter electrodes 21 between adjacent ones of the segments, can be reduced. Consequently, luminance differences in the pixels in the vicinities of boundaries between adjacent segments can be reduced.

Embodiment 3

Embodiment 1 described above is described with reference to a touch-panel-equipped display device in which the signal lines 22 are provided on the active matrix substrate 1, and the counter electrodes 21 are used in a controlling operation for displaying an image and a controlling operation for detecting a touch position. The present embodiment is described with reference to a liquid crystal display device that does not have a function of a touch panel.

Figure 9:
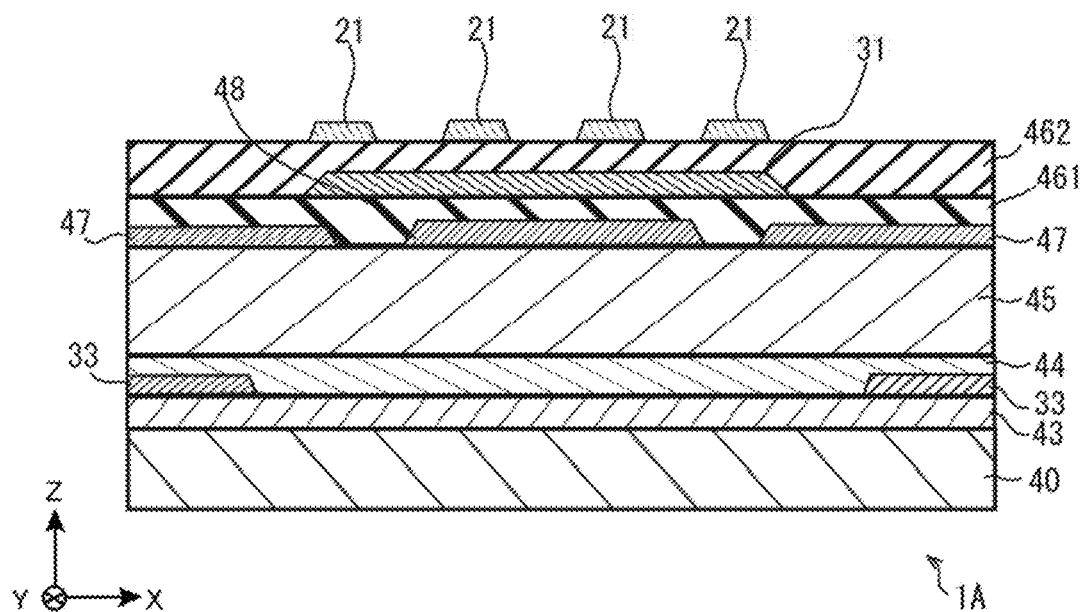
FIG. 9 is a schematic cross-sectional view of an active matrix substrate in Embodiment 3.

FIG. 9 is a cross-sectional view of an active matrix substrate used in a liquid crystal display device in the present embodiment. In FIG. 9, the same constituent members as those in Embodiment 1 are denoted by the same reference symbols as those in Embodiment 1. Though the illustration of the TFTs is omitted in FIG. 9, TFTs 42 identical to those in Embodiment 1 described above are provided in the pixels, respectively.

As illustrated in FIG. 9, on an active matrix substrate 1A in the present embodiment, the signal lines 22 for supplying a touch driving signal are not formed on the conductive film 47. Further, the conductive film 47 has a width greater than the width of the source line 33 so that the conductive film 47 partially overlaps with the pixel electrode 31, and is arranged so as to be positioned apart from the auxiliary capacitance electrode 48. In other words, the conductive film 47 is arranged so as to interrupt between the pixel electrode 31 and the source line 33. With this configuration, a parasitic capacitance between the pixel electrode 31 and the source line 33 is reduced, whereby display defects such as shadowing and the like can be reduced.

Further, since the auxiliary capacitance electrode 48 is positioned apart from the conductive film 47 and has a width smaller than that of the pixel electrode 31, the capacitance between the pixel electrode 31 and the auxiliary capacitance electrode 48 do not increase to a level higher than required, and the pixel capacitance in accordance with the driving capability of the TFT 42 can be achieved. The distance between the auxiliary capacitance electrode 48 and the conductive film 47 is, for example, 3 μm, but it is appropriately set with the driving capability of the TFT 42 being taken into consideration.

Examples of the touch-panel-equipped display device according to the present invention are described above, but the touch-panel-equipped display device according to the present invention is not limited to the configurations of the above-described embodiments, and may have a variety of modified configurations. The modification examples are described below.

Modification Example 1

In the above-described embodiments and modification examples, an etching stopper layer may be provided between the source electrode 42c and the drain electrode 42d of the TFT 42. This configuration makes it possible to prevent the semiconductor film 42b from being damaged by etching performed when the source electrode 42c, the drain electrode 42d, and the like are formed.

Modification Example 2

Further, the above-described embodiments and modification examples are described with reference to an example in which bottom-gate-type TFTs are used, but the TFTs may be top-gate-type TFTs. Further, the semiconductor film 42b is not limited to the oxide semiconductor film, but may be an amorphous silicon film.

The invention claimed is:
1. An active matrix substrate comprising:
a plurality of data lines;
a plurality of pixel electrodes;
a plurality of counter electrodes each of which is provided opposite to one of the plurality of pixel electrodes, respectively, first capacitors being formed between the plurality of counter electrodes and the plurality of pixel electrodes;
a conductive layer provided on a side opposite to the plurality of counter electrodes with respect to the plurality of pixel electrodes;
a first insulating layer;
a second insulating layer;
a third insulating layer; and
a plurality of signal lines that is connected to each of the plurality of counter electrodes, and supplies a touch detection driving signal to the each of the plurality of counter electrodes, the plurality of signal lines partially overlapping with the plurality of data lines;
wherein:
the first insulating layer is arranged between each of the plurality of pixel electrodes and the conductive layer, and the second insulating layer is arranged between each of the plurality of pixel electrodes and a corresponding one of the plurality of counter electrodes;
the conductive layer is arranged on the third insulating layer;
the conductive layer includes:
a plurality of first portions each of which is provided opposite to the plurality of pixel electrodes, respectively, and overlap with the plurality of pixel electrodes, thereby forming second capacitors therebetween; and
a plurality of second portions provided between the third insulating layer and the plurality of signal lines, a first surface of each of the plurality of second portions contacts the third insulating layer and a second surface of each of the plurality of second portions contacts the plurality of signal lines;
the plurality of first portions and the plurality of second portions of the conductive layer are positioned apart from each other; and
each of the plurality of first portions electrically connects to the corresponding one of the plurality of counter electrodes via a corresponding one of a plurality of first contact holes and directly contacts the corresponding one of the plurality of counter electrodes, and each of the plurality of second portions and the corresponding one of the plurality of counter electrodes are electrically connected via a corresponding one of a plurality of second contact holes through the first insulating layer and the second insulating layer, such that the plurality of first portions and the plurality of second portions are electrically connected via the corresponding ones of the plurality of counter electrodes, the corresponding ones of the plurality of first contact holes, and the corresponding ones of the plurality of second contact holes.

2. The active matrix substrate according to claim 1, wherein
each of the plurality of second portions has a width greater than a width of the data line.

3. A touch-panel-equipped display device comprising:
the active matrix substrate according to claim 1;
a counter substrate arranged opposite to the active matrix substrate; and
a liquid crystal layer interposed between the active matrix substrate and the counter substrate.

4. The touch-panel-equipped display device according to claim 3, wherein:
the active matrix substrate further comprises a plurality of gate lines that intersects with the data lines,
the plurality of counter electrodes is arranged in a direction in which the plurality of gate lines extends and a direction in which the plurality of data lines extends, and
each of the plurality of first portions is opposite a corresponding one of the plurality of pixel electrodes with the first insulating layer being interposed therebetween, and is arranged approximately in parallel with the plurality of data lines.

5. The touch-panel-equipped display device according to claim 4, wherein, to each of the plurality of gate lines, a scanning voltage signal is supplied at fixed intervals, and periods while the scanning voltage signal is supplied to adjacent ones of the plurality of gate lines partially overlap with each other.

6. The touch-panel-equipped display device according to claim 3, wherein each of the plurality of signal lines has a specific resistance smaller than a resistance of the conductive layer.

7. The touch-panel-equipped display device according to claim 3, wherein:
the active matrix substrate has a display area where the plurality of pixel electrodes is provided, and
each of the plurality of counter electrodes is connected to a corresponding one of the plurality of first portions in the display area.

8. The touch-panel-equipped display device according to claim 7, wherein the active matrix substrate includes contact holes formed in the first insulating layer and the second insulating layer, and each of the plurality of counter electrodes is connected to the corresponding one of the plurality of first portions through a corresponding one of the plurality of contact holes.

9. The touch-panel-equipped display device according to claim 3, wherein:
the active matrix substrate has a display area where the plurality of pixel electrodes is provided, and
each of the plurality of counter electrodes is not connected to a corresponding one of the plurality of first portions in the display area.

10. The touch-panel-equipped display device according to claim 9, wherein, while the driving signal is being supplied to the plurality of signal lines, the plurality of first portions is in an electrically floating state.

11. The active matrix substrate according to claim 1, further comprising:
a plurality of gate lines that intersects with the plurality of data lines; and
an insulating layer including an organic film, between at least either the plurality of gate lines or the plurality of data lines, and the plurality of first portions.

12. The active matrix substrate according to claim 1, wherein the plurality of first portions is provided so that each of the plurality of first portions is opposite to at least two of the plurality of counter electrodes.

13. A liquid crystal display device comprising:
the active matrix substrate according to claim 1;
a counter substrate arranged opposite to the active matrix substrate; and
a liquid crystal layer interposed between the active matrix substrate and the counter substrate.

14. The active matrix substrate according to claim 1, wherein each of the plurality of second portions of the conductive layer and the corresponding one of the plurality of counter electrodes are connected via a corresponding one of the signal lines.

* * * * *